US012764954B2

(12) United States Patent
Nakatsuka

(10) Patent No.: US 12,764,954 B2
(45) Date of Patent: Oct. 13, 2026

(54) SEMICONDUCTOR MEMORY DEVICE

(71) Applicant: Kioxia Corporation, Tokyo (JP)

(72) Inventor: Keisuke Nakatsuka, Kobe Hyogo (JP)

(73) Assignee: Kioxia Corporation, Tokyo (JP)

( * ) Notice: Subject to any disclaimer, the term of this patent is extended or adjusted under 35 U.S.C. 154(b) by 170 days.

(21) Appl. No.: 17/942,009

(22) Filed: Sep. 9, 2022

(65) Prior Publication Data

US 2023/0005957 A1 Jan. 5, 2023

Related U.S. Application Data

(63) Continuation of application No. PCT/JP2020/012654, filed on Mar. 23, 2020.

(51) Int. Cl.

| | |
|---|---|
| ***H10B 43/27*** | (2023.01) |
| ***G11C 16/04*** | (2006.01) |
| ***G11C 16/26*** | (2006.01) |
| ***H10W 80/00*** | (2026.01) |
| ***H10W 90/00*** | (2026.01) |

(52) U.S. Cl.

CPC ......... *H10B 43/27* (2023.02); *G11C 16/0483* (2013.01); *G11C 16/26* (2013.01); *H10W 90/00* (2026.01); *H10W 80/312* (2026.01); *H10W 80/327* (2026.01); *H10W 90/792* (2026.01)

(58) Field of Classification Search

CPC .... H10B 43/27; G11C 16/0483; G11C 16/26; G11C 16/24; H01L 2224/80896; H10W 90/00; H10W 80/312; H10W 80/327; H10W 90/792; H10W 80/00

USPC ...................................................... 365/185.21

See application file for complete search history.

(56) References Cited

U.S. PATENT DOCUMENTS 9,842,851 B2 * 12/2017 Pachamuthu .......... H10B 43/27
9,911,752 B2 * 3/2018 Kashima ................ H10B 43/27
10,381,374 B2 8/2019 Tagami et al.
(Continued)

FOREIGN PATENT DOCUMENTS

CN 110277395 A 9/2019
CN 110289264 A 9/2019
(Continued)

OTHER PUBLICATIONS

Hara, S., "Twin Brothers, Ohmic Contact," Shiro Hara Research Web, https://staff.aist.go.jp/shiro-hara/schottky/ohmic.html, Accessed Jul. 20, 2022 (5 pages).
(Continued)

*Primary Examiner* — Allison Bernstein
(74) *Attorney, Agent, or Firm* — Foley & Lardner LLP

(57) ABSTRACT

A semiconductor memory device according to an embodiment includes a substrate, a first conductor layer, second conductor layers, a first semiconductor layer, a pillar, and a contact. The pillar has a portion provided to penetrate the second conductor layers and the first semiconductor layer. The contact is electrically connected to the pillar and the first conductor layer. The pillar includes a second semiconductor layer, a first insulator layer provided at least between the second semiconductor layer and the second conductor layers, and a third semiconductor layer provided between the second semiconductor layer and the first semiconductor layer and in contact with each of the second semiconductor layer and the first semiconductor layer.

10 Claims, 20 Drawing Sheets

(56) References Cited

U.S. PATENT DOCUMENTS

| | | | | |
|---|---|---|---|---|
| 10,438,966 | B2 | 10/2019 | Shioda et al. | |
| 10,515,873 | B2 | 12/2019 | Yoshimizu et al. | |
| 11,056,501 | B2 | 7/2021 | Wada et al. | |
| 2008/0173932 | A1 * | 7/2008 | Kidoh .................... | H10D 30/69 257/E21.679 |
| 2017/0092654 | A1 | 3/2017 | Nishikawa et al. | |
| 2019/0287997 | A1 | 9/2019 | Komiya et al. | |
| 2019/0288059 | A1 | 9/2019 | Tachikawa et al. | |
| 2019/0333931 | A1 | 10/2019 | Jung et al. | |
| 2020/0075621 | A1 * | 3/2020 | Nakaki ................ | H10D 64/037 |

FOREIGN PATENT DOCUMENTS

| | | | |
|---|---|---|---|
| CN | 110880512 | A | 3/2020 |
| JP | 2018-152412 | A | 9/2018 |
| JP | 2019-041054 | A | 3/2019 |
| JP | 2019-050271 | A | 3/2019 |
| JP | 2019-057532 | A | 4/2019 |

OTHER PUBLICATIONS

Sugiyama, K., “Metal-Semiconductor Contact,” http://www.osakac.ac.jp/labs/matsuura/japanese/lecture/semicondic/ka/ka010.pdf, Accessed Jul. 20, 2022 (4 pages).

Yamashita, I., “3.MESFET,” Lightning stone family, http://denkou.cdx.jp/Ele/E4/EF4_3.html, Accessed Jul. 20, 2022 (5 pages).

* cited by examiner

Read operation

SEMICONDUCTOR MEMORY DEVICE

CROSS-REFERENCE TO RELATED APPLICATIONS

This application is a Continuation application of PCT Application No. PCT/JP2020/012654, filed Mar. 23, 2020, the entire contents of which are incorporated herein by reference.

FIELD

The present embodiment relates to a semiconductor memory device.

BACKGROUND

A NAND flash memory capable of storing data in a nonvolatile manner is known.

DETAILED DESCRIPTION

In general, according to one embodiment, a semiconductor memory device includes a substrate, a first conductor layer, a plurality of second conductor layers, a first semiconductor layer, a pillar, and a contact. The first conductor layer has a portion provided to extend in a first direction in a first layer above the substrata. The second conductor layers are provided to be apart from each other in a second direction intersecting the first direction above the first layer. The first semiconductor layer has a portion provided to spread in a third direction intersecting each of the first direction and the second direction, and the first direction, in a layer above the plurality of second conductor layers. The pillar is provided to extend in the second direction and having a portion provided to penetrate the plurality of second conductor layers and the first semiconductor layer. The contact is electrically connected to the pillar and the first conductor layer. The pillar includes a second semiconductor layer provided to extend in the second direction, a first insulator layer provided at least between the second semiconductor layer and the plurality of second conductor layers, and a third semiconductor layer provided between the second semiconductor layer and the first semiconductor layer and in contact with each of the second semiconductor layer and the first semiconductor layer.

Embodiments will be described below with reference to the drawings. The embodiments exemplify a device and method that realize the technical concept of the invention. The drawings are provided merely for schematic or conceptual purposes, and thus dimensions, ratios, and the like of each drawing may not be identical to actual ones. The technical concept of the present invention is not limited by the shape, structure, arrangement, and the like of the components.

In the following explanation, components having basically the same functions and structures will be referred to by the same reference symbols. Numbers after characters constituting the reference symbols are referred to by reference symbols including the same characters, and are used to distinguish between components having similar configurations. Similarly, characters after numbers constituting the reference symbols are referred to by reference symbols including the same numbers, and are used to distinguish between components having similar configurations. When components having reference symbols including the same character or number need not be distinguished from each other, these components are each referred to by reference symbols including characters or numbers only.

Embodiment

Hereinafter, a semiconductor memory device 1 according to an embodiment will be described.

<1> Configuration

<1-1> Overall Configuration of Semiconductor Memory Device 1

Figure 1:
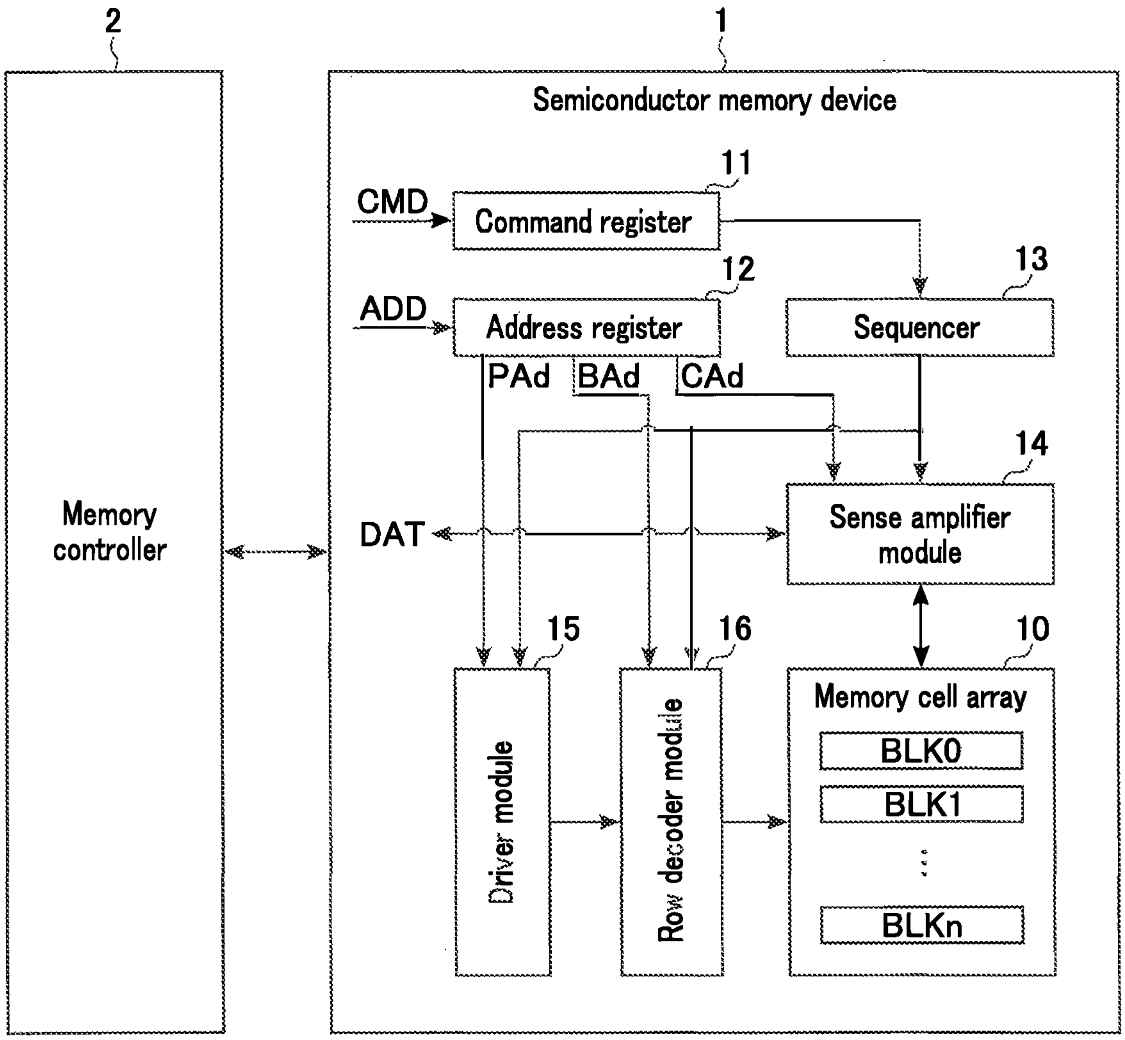
FIG. 1 is a block diagram illustrating a configuration example of a semiconductor memory device according to an embodiment.

FIG. 1 illustrates a configuration example of the semiconductor memory device 1 according to the embodiment. As illustrated in FIG. 1, the semiconductor memory device 1 can be controlled by an external memory controller 2. In addition, the semiconductor memory device 1 includes, for example, a memory cell array 10, a command register 11, an address register 12, a sequencer 13, a sense amplifier module 14, a driver module 15, and a row decoder module 16.

The memory cell array 10 includes a plurality of blocks BLK0 to BLKn (where n is an integer greater than or equal to 1). A block BLK is a set of a plurality of memory cells that can store data in a nonvolatile manner, and is used, for example, as a data erase unit. The memory cell array 10 is provided with a plurality of bit lines and word lines. Each memory cell is associated with, for example, one bit line and one word line.

The command register 11 holds a command CMD that the semiconductor memory device 1 receives from the memory controller 2. A command CMD includes, for example, commands for causing the sequencer 13 to perform a read operation, write operation, erase operation, and the like.

The address register 12 holds address information ADD that the semiconductor memory device 1 receives from the memory controller 2. The address information ADD includes a block address BAd, a page address PAd, and a column address CAd. For example, the block address BAd, page address PAd, and column address CAd may be used for selection of a block BLK, a word line, and a bit line, respectively.

The sequencer 13 controls the overall operation of the semiconductor memory device 1. For example, the sequencer 13 controls the sense amplifier module 14, driver module 15, row decoder module 16, and the like based on a command CMD held in the command register 11, and thereby execute the read operation, write operation, erase operation or the like.

In the write operation, the sense amplifier module 14 applies a desired voltage to each of the bit lines in accordance with the write data DAT received from the memory controller 2. In the read operation, the sense amplifier module 14 determines data stored in the memory cell based on the voltage of the bit line, and transfers the determination result as read-out data DAT to the memory controller 2.

The driver module 15 generates a voltage to be used for the read operation, write operation, and erase operation. The driver module 15 then applies the generated voltage to the signal line corresponding to the selected word line, for example based on the page address PAd held in the address register 12.

The row decoder module 16 selects one of the blocks BLK in the corresponding memory cell array 10 based on the block address BAd held in the address register 12. The row decoder module 16 then transfers the voltage applied to the signal line corresponding to the selected word line, to this selected word line in the selected block BLK.

The above-described semiconductor memory device 1 and memory controller 2 may be combined into a single semiconductor device. Examples of such semiconductor devices include a memory card such as an SD™ card and a solid state drive (SSD).

<1-2> Circuit Configuration of the Semiconductor Memory Device 1

<1-2-1> Circuit Configuration of the Memory Cell Array 10

Figure 2:
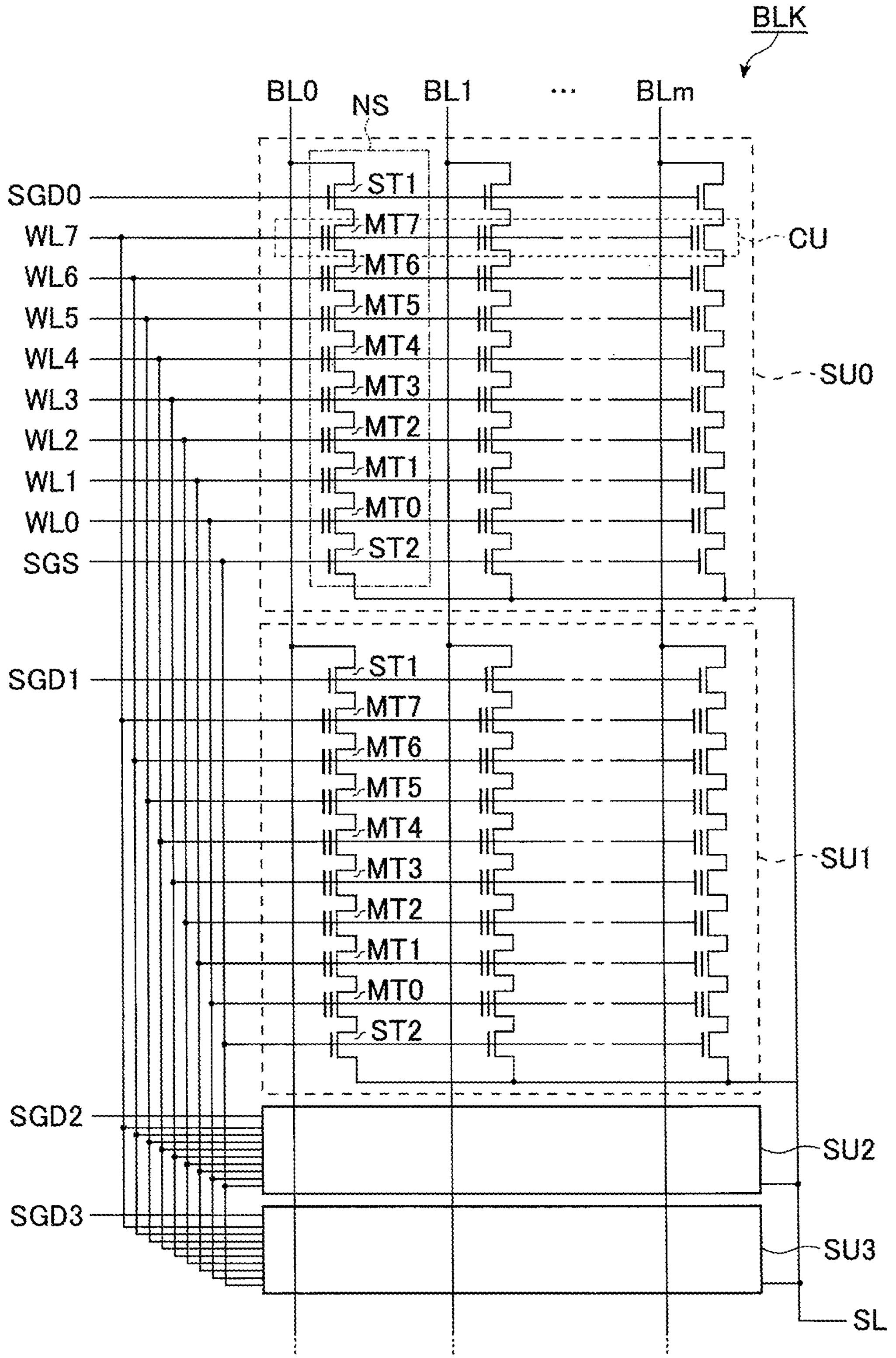
FIG. 2 is a circuit diagram illustrating an example of a circuit configuration of a memory cell array included in the semiconductor memory device according to the embodiment.

FIG. 2 illustrates an example of a circuit configuration of the memory cell array 10 included in the semiconductor memory device 1 according to the embodiment. Each of the blocks BLK includes, for example, four string units SU0 to SU3, and details of two string units SU0 and SU1 included in the same block BLK are illustrated in FIG. 2.

Each of the string units SU includes a plurality of NAND strings NS each associated with one of bit lines BL0 to BLm (where m is an integer greater than or equal to 1). Each of the NAND strings NS includes, for example, memory cell transistors MT0 to MT7 and select transistors ST1 and ST2. The memory cell transistor MT includes a control gate and a charge storage layer, and holds data in a nonvolatile manner. Each of the select transistors ST1 and ST2 is used to select the string unit SU during various operations.

In each of the NAND strings NS, the memory cell transistors MT0 to MT7 are connected in series. The drain of the select transistor ST1 is connected to the associated bit line BL. The source of the select transistor ST1 is connected to one end of the memory cell transistors MT0 to MT7 that are connected in series. The drain of the select transistor ST2 is connected to the other end of the memory cell transistors MT0 to MT7 that are connected in series. The source of the select transistor ST2 is connected to a source line SL.

Within a block BLK, the control gates of the memory cell transistors MT0 to MT7 are commonly connected to the word lines WL0 to WL7, respectively. The gates of the select transistors ST1 in each of the string units SU0 to SU3 are commonly connected to the select gate lines SGD0 to SGD3, respectively. The gates of the select transistors ST2 within a block BLK are commonly connected to the select gate line SGS.

Different column addresses are assigned to the bit lines BL0 to BLm. Each of the bit lines BL is shared by the NAND strings NS to which the same column address is assigned across a plurality of blocks BLK. Each of the word lines WL0 to WL7 is provided for each block BLK. The source line SL is shared among a plurality of blocks BLK.

A set of a plurality of memory cell transistors MT connected to a common word line WL within one string unit SU is referred to as, for example, a cell unit CU. For example, the storage capacity of the cell unit CU including the memory cell transistors MT that each store 1-bit data is defined as 1-page data. The cell unit CU may have a storage capacity of 2-page data or more according to the number of bits of data stored in the memory cell transistor MT.

Note that the circuit configuration of the memory cell array 10 included in the semiconductor memory device 1 according to the embodiment is not limited to the above-described configuration. For example, the number of string units SU included in each block BLK and the numbers of memory cell transistors MT and select transistors ST1 and ST2 included in each NAND string NS may be designed to any numbers.

<1-2-2> Circuit Configuration of the Sense Amplifier Module 14

Figure 3:
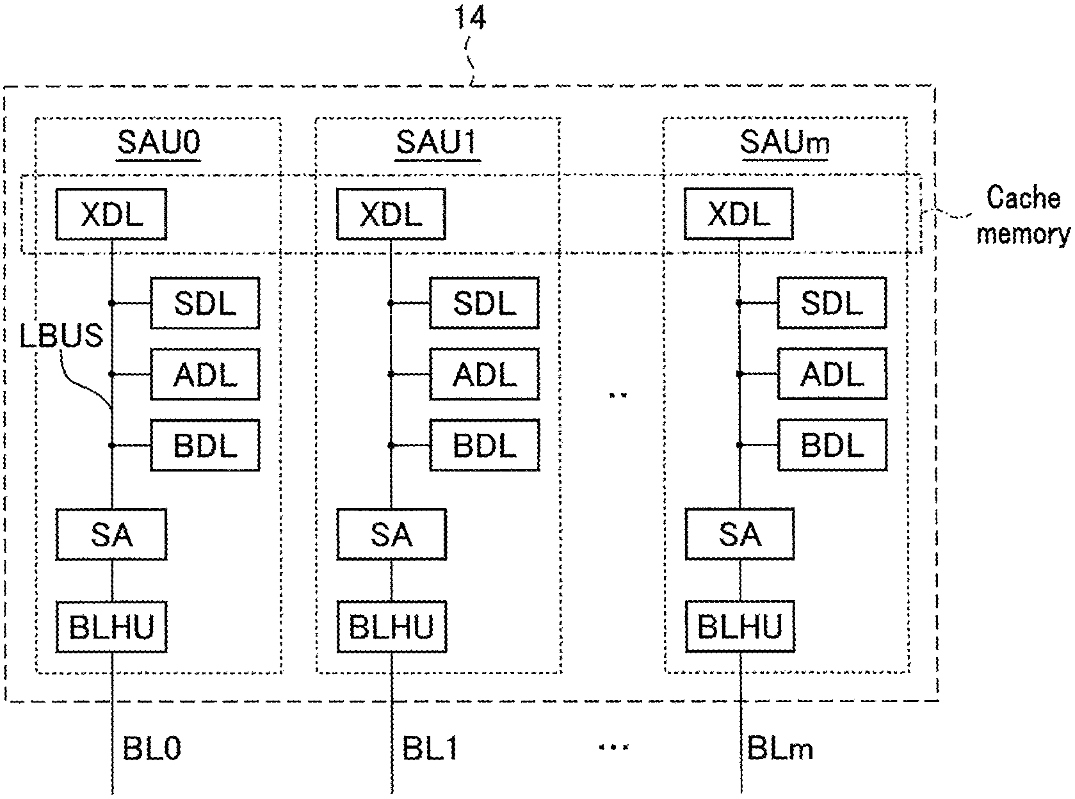
FIG. 3 is a circuit diagram illustrating an example of a circuit configuration of a sense amplifier module included in the semiconductor memory device according to the embodiment.

FIG. 3 illustrates an example of a circuit configuration of the sense amplifier module 14 included in the semiconductor memory device 1 according to the embodiment. As illustrated in FIG. 3, the sense amplifier module 14 includes a plurality of sense amplifier units SAU0 to SAUm. The sense amplifier units SAU0 to SAUm are associated with the bit lines BL0 to BLm, respectively. Each of the sense amplifier units SAU includes, for example, a bit line connection section BLHU, a sense amplification section SA, a bus LBUS, and latch circuits SDL, ADL, BDL, and XDL.

In each sense amplifier unit SAU, the bit line connection section BLHU is connected between the associated bit line BL and the sense amplification section SA. For example, in the read operation, the sense amplification section SA determines whether the read data is “0” or “1” based on the voltage of the associated bit line BL. In other words, the sense amplification section SA senses the data read to the associated bit line BL and determines the data stored in the selected memory cell. Each of the latch circuits SDL, ADL, BDL and XDL temporarily holds read data, write data, and the like.

The sense amplification section SA, and the latch circuits SDL, ADL, BDL, and XDL are each connected to the bus LBUS, and can transmit and receive data to and from each other via the bus LBUS. The latch circuit XDL is connected to an input/output circuit (not shown) of the semiconductor memory device 1 and used to input/output data between the sense amplifier unit SAU and the input/output circuit. The latch circuit XDL may also be used as, for example, a cache memory of the semiconductor memory device 1. For instance, even if the latch circuits SDL, ADL and BDL are in use, the semiconductor memory device 1 can be placed in a ready state if the latch circuit XDL is not busy.

Figure 4:
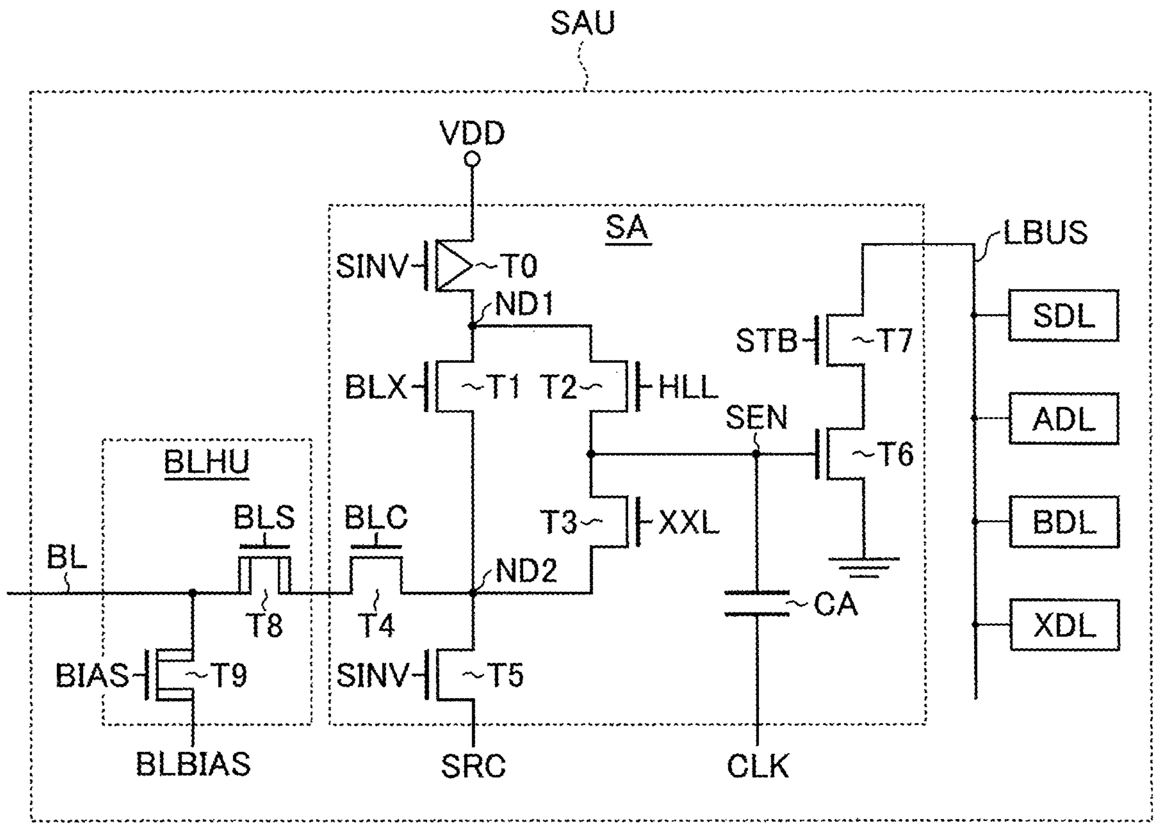
FIG. 4 is a circuit diagram illustrating an example of a circuit configuration of a sense amplifier unit in the semiconductor memory device according to the embodiment.

FIG. 4 illustrates an example of a circuit configuration of the sense amplifier unit SAU in the semiconductor memory device 1 according to the embodiment. As illustrated in FIG. 4, for example, the sense amplification section SA includes transistors T0 to T7 and a capacitor CA, and the bit line connection section BLHU includes transistors T8 and T9.

The transistor T0 is a P-type MOS transistor. Each of the transistors T1 to T7 is an N-type MOS transistor. Each of the transistors T8 and T9 is an N-type MOS transistor having a higher breakdown voltage than each of the transistors T0 to T7. Hereinafter, the transistors T0 to T7 are also referred to as low breakdown voltage transistors, and the transistors T8 and T9 are also referred to as high breakdown voltage transistors.

The source of the transistor T0 is connected to a power supply line. The drain of the transistor T0 is connected to a node ND1. The gate of the transistor T0 may be connected to, for example, a node SINV in the latch circuit SDL. The drain of the transistor T1 is connected to the node ND1. The source of the transistor T1 is connected to a node ND2. A control signal BLX is input to the gate of the transistor T1. The drain of the transistor T2 is connected to the node ND1. The source of the transistor T2 is connected to a node SEN. A control signal HLL is input to the gate of the transistor T2.

The drain of the transistor T3 is connected to the node SEN. The source of the transistor T3 is connected to the node ND2. A control signal XXL is input to the gate of the transistor T3. The drain of the transistor T4 is connected to the node ND2. A control signal BLC is input to the gate of the transistor T4. The drain of the transistor T5 is connected to the node ND2. The source of the transistor T5 is connected to a node SRC. The gate of the transistor T5 may be connected to, for example, the node SINV in the latch circuit SDL.

The source of the transistor T6 is grounded. The gate of the transistor T6 is connected to the node SEN. The drain of the transistor T7 is connected to the bus LBUS. The source of the transistor T7 is connected to the drain of the transistor T6. A control signal STB is input to the gate of the transistor T7. One electrode of the capacitor CA is connected to the node SEN. A clock CLK is input to the other electrode of the capacitor CA.

The drain of the transistor T8 is connected to the source of the transistor T4. The source of the transistor T8 is connected to the bit line BL. A control signal BLS is input to the gate of the transistor T8. The drain of the transistor T9 is connected to a node BLBIAS. The source of the transistor T9 is connected to the bit line BL. A control signal BIAS is input to the gate of the transistor T9.

The latch circuit SDL holds data at a node SINV (not illustrated). The voltage of the node SINV changes based on the data held by the latch circuit SDL. The circuit configurations of the latch circuits ADL, BDL, and XDL are similar to the circuit configuration of the latch circuit SDL, for example. For example, the latch circuit ADL holds data at a node AINV. The same applies to the latch circuits BDL and XDL.

In the above-described circuit configuration of the sense amplifier unit SAU, for example, a power supply voltage VDD is applied to the power supply line connected to the source of the transistor TO. For example, a ground voltage VSS is applied to the node SRC. For example, an erase voltage VERA is applied to the node BLBIAS. Each of the control signals BLX, HLL, XXL, BLC, STB, BLS, and BIAS, as well as the clock CLK, is generated by the sequencer 13, for example. In the read operation, the sense amplification section SA determines the data read out to the bit line BL based on, for example, the timing at which the control signal STB is asserted.

Note that the sense amplifier module 14 included in the semiconductor memory device 1 according to the embodiment is not limited to the above-described circuit configuration. For instance, the number of latch circuits included in each of the sense amplifier units SAU may be suitably changed based on the number of pages stored in one cell unit CU. The sense amplification section SA may have any circuit configuration other than the above, as long as it can determine data read out to the bit line BL. In the bit line connection section BLHU, the transistor T9 may be omitted.

<1-3> Structure of the Semiconductor Memory Device 1

Hereinafter, an example of a structure of the semiconductor memory device 1 according to the embodiment will be described. In the drawings referred to below, the X direction corresponds to the extending direction of the word line WL, the Y direction corresponds to the extending direction of the bit line BL, and the Z direction corresponds to the vertical direction with respect to the surface of a semiconductor substrate used for the formation of the semiconductor memory device 1. In the plan views, a hatching is appropriately added to enhance the visibility of the drawings. The hatching added to the plan views is not necessarily associated with a material or a characteristic of the component to which the hatching is added. In each of the plan views and the cross-sectional views, wirings, contacts, interlayer insulating films, and the like are appropriately omitted to enhance the visibility of the drawings.

<1-3-1> Overall Structure of the Semiconductor Memory Device

Figure 5:
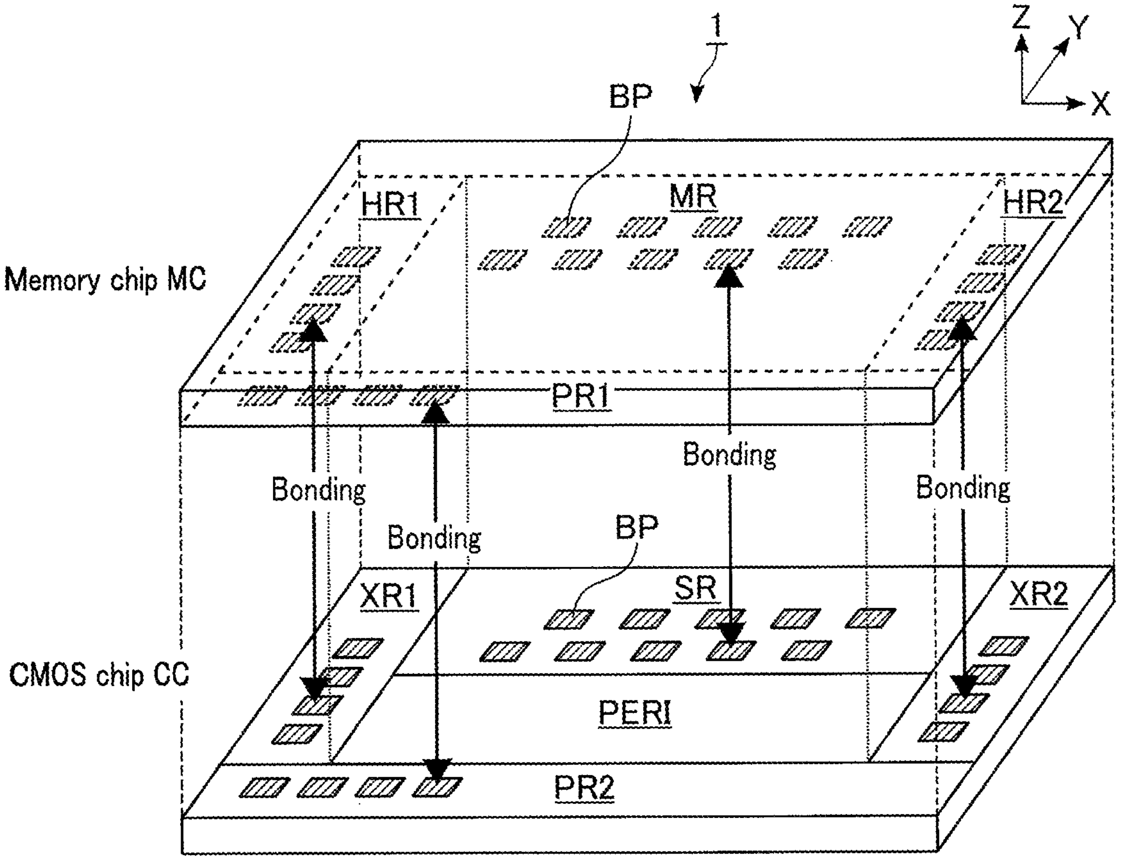
FIG. 5 is a perspective view illustrating an example of a structure of the semiconductor memory device according to the embodiment.

FIG. 5 illustrates an example of the overall structure of the semiconductor memory device 1 according to the embodiment. As illustrated in FIG. 5, the semiconductor memory device 1 includes a memory chip MC and a CMOS chip CC, with the bottom surface of the memory chip MC and the top surface of the CMOS chip CC bonded to each other. The memory chip MC includes a structure corresponding to the memory cell array 10. The CMOS chip CC includes a structure corresponding to, for example, the sequencer 13, command register 11, address register 12, sequencer 13, sense amplifier module 14, driver module 15, and row decoder module 16.

The region of the memory chip MC is divided into, for example, a memory region MR, hookup regions HR1 and HR2, and a pad region PR1. The memory region MR occupies most of the memory chip MC and is used for data storage. For example, the memory region MR includes a plurality of NAND strings NS. The hookup regions HR1 and HR2 sandwich the memory region MR in the X direction. The hookup regions HR1 and HR2 are used for connection between the stacked wiring in the memory chip MC and the row decoder module 16 in the CMOS chip CC. The pad region PR1 is adjacent to each of the memory region MR and the hookup regions HR1 and HR2 in the Y direction. The pad region PR1 includes, for example, a circuit related to the input/output circuit of the semiconductor memory device 1.

The memory chip MC has a plurality of bonding pads BP on bottom of each of the memory region MR, hookup regions HR1 and HR2, and pad region PR1. The bonding pad BP is also referred to as, for example, a joint metal. The bonding pad BP in the memory region MR is connected to the associated bit line BL. The bonding pad BP in the hookup region HR is connected to the associated wiring (for example, the word line WL) among the stacked wirings provided in the memory region MR. The bonding pad BP in the pad region PR1 is electrically connected to a pad (not illustrated) provided on the memory chip MC. The pad provided on the memory chip MC is used, for example, for connection between the semiconductor memory device 1 and the memory controller 2.

The region of the CMOS chip CC is divided into, for example, a sense amplifier region SR, a peripheral circuit region PERI, transfer regions XR1 and XR2, and a pad region PR2. The sense amplifier region SR and the peripheral circuit region PERI are arranged adjacent to each other in the Y direction, and overlap the memory region MR. The sense amplifier region SR includes the sense amplifier module 14. The peripheral circuit region PERI includes the sequencer 13 and the like. The transfer regions XR1 and XR2 sandwich a set of the sense amplifier region SR and the peripheral circuit region PERI in the X direction, and overlap the hookup regions HR1 and HR2, respectively. The transfer regions XR1 and XR2 include a plurality of transistors corresponding to the row decoder module 16. The pad region PR2 is arranged so as to overlap the pad region PR1 in the memory chip MC, and includes the input/output circuit and the like of the semiconductor memory device 1.

The CMOS chip CC has a plurality of bonding pads BP on the top of each of the sense amplifier region SR, peripheral circuit region PERI, transfer regions XR1 and XR2, and pad region PR2. The plurality of bonding pads BP in the sense amplifier region SR are arranged so as to each overlap the plurality of bonding pads BP in the memory region MR. The plurality of bonding pads BP in the transfer region XR1 are arranged so as to each overlap the plurality of bonding pads BP in the hookup region HR1. The plurality of bonding pads BP in the transfer region XR2 are arranged so as to each overlap the plurality of bonding pads BP in the hookup region HR2. The plurality of bonding pads BP in the pad region PR1 are arranged so as to each overlap the plurality of bonding pads BP in the hookup region PR2.

Among the plurality of bonding pads BP provided in the semiconductor memory device 1, two bonding pads BP facing each other between the memory chip MC and the CMOS chip CC are bonded to each other ("bonding" in FIG. 5). This causes the circuit in the memory chip MC and the circuit in the CMOS chip CC to be electrically connected. A set of two bonding pads BP facing each other between the memory chip MC and the CMOS chip CC may have a boundary or may be integrated.

Note that the semiconductor memory device 1 according to the embodiment is not limited to the above-described structure. For example, it suffices that at least one hookup region HR adjacent to the memory region MR is provided. The semiconductor memory device 1 may include a plurality of sets of the memory region MR and hookup region HR. In this case, a set of the sense amplifier region SR, the transfer region XR, and the peripheral circuit region PERI is appropriately provided so as to correspond to the arrangement of the memory region MR and the hookup region HR.

Figure 6:
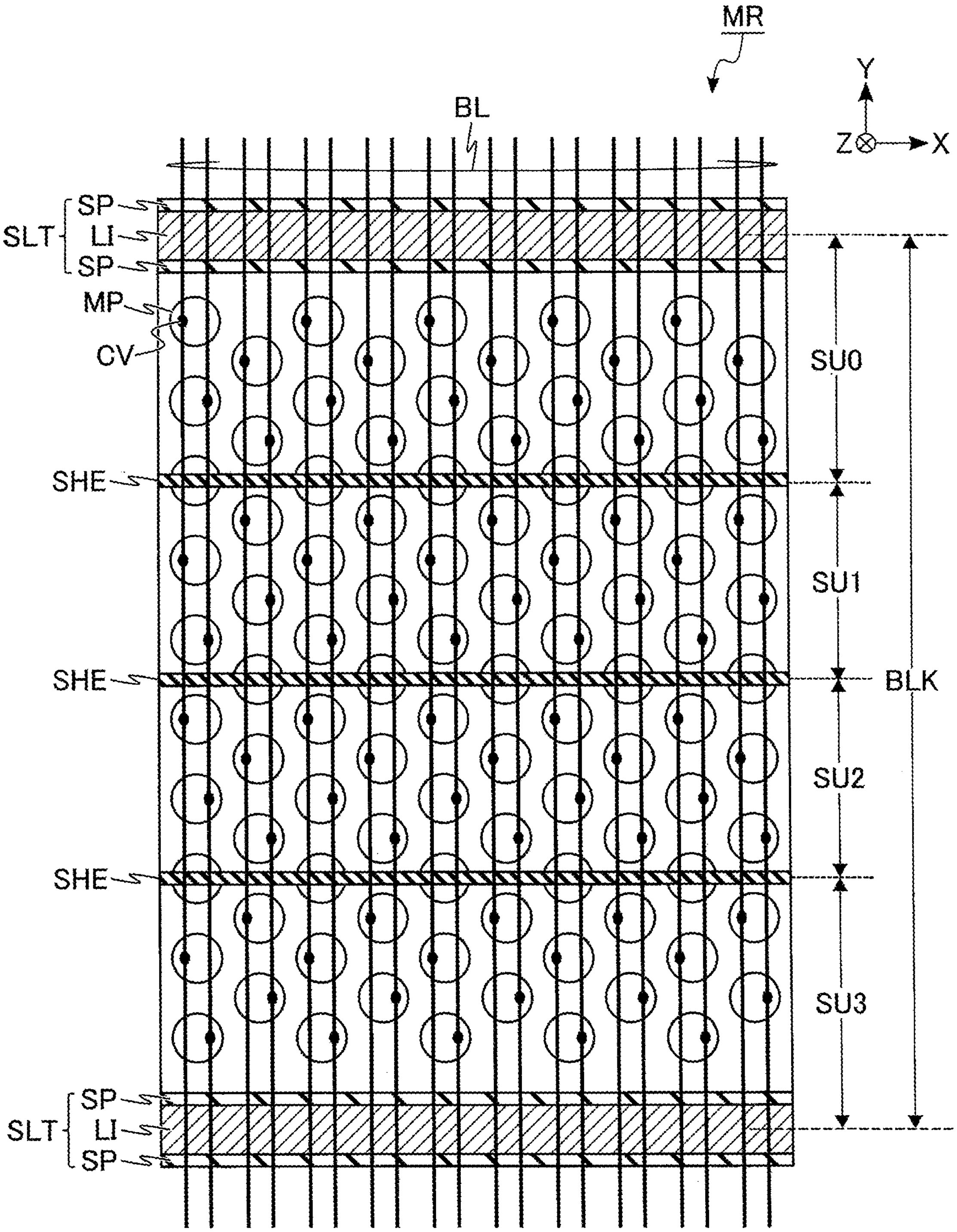
FIG. 6 is a plan view illustrating an example of a planar layout of a memory region in the semiconductor memory device according to the embodiment.

<1-3-2> Structure of the Semiconductor Memory Device 1 in the Memory Region MR FIG. 6 illustrates an example of a detailed planar layout in the memory region MR of the semiconductor memory device 1 according to the embodiment, and illustrates a region including one block BLK (that is, the string units SU0 to SU3). As illustrated in FIG. 6, in the memory region MA, the semiconductor memory device 1 includes a plurality of slits SLT, a plurality of slits SHE, a plurality of memory pillars MP, a plurality of contacts CV, and a plurality of bit lines BL.

The plurality of slits SLT each have a portion provided so as to extend along the X direction, and are arranged in the Y direction. Each of the plurality of slits SLT crosses the memory region MA and the hookup regions HR1 and HR2 along the X direction. Each of the slit SLTs divides and insulates wirings adjacent to each other across the slit SLT (for example, the word lines WL0 to WL7 and the select gate lines SGD and SGS).

Each slit SLT includes a contact LI and a spacer SP. The contact LI is a conductor having a portion extending in the X direction. The spacer SP is an insulator provided on a side surface of the contact LI. The contact LI and the conductor adjacent to the contact LI in the Y direction are separated and insulated by the spacer SP. The contact LI is used, for example, as a part of the source line SL.

The plurality of slits SHE are each provided across the memory region MR and are arranged in the Y direction. The slit SHE divides at least the select gate line SGD. In this example, three slits SHE are arranged between the adjacent slits SLT. The slit SHE has an insulator structure in which an insulating member is embedded. The slit SHE divides wirings adjacent to each other across the slit SLT (at least the select gate line SGD).

Each of the memory pillars MP functions as, for example, one NAND string NS. The plurality of memory pillars MP are arranged in a staggered manner, for example, in 19 rows in a region between two adjacent slits SLT. Then, for example, one slit SHE overlaps each of the memory pillar MP of the fifth row, the memory pillar MP of the 10th row, and the memory pillar MP of the 15th row when counted from the upper side of the paper surface.

The plurality of bit lines BL each extend in the Y direction and are arranged in the X direction. Each of the bit lines BL is arranged so as to overlap at least one memory pillar MP at each string unit SU. In this example, two bit lines BL are arranged so as to overlap each memory pillar MP. A contact CV is provided between one of the plurality of bit lines BL overlapping the memory pillar MP and the memory pillar MP. Each of the memory pillars MP is electrically connected to the corresponding bit line BL via the contact CV.

The contact CV between the memory pillar MP overlapping the slit SHE and the bit line BL is omitted. In other words, the contact CV between the memory pillar MP in contact with two different select gate lines SGD and the bit line BL is omitted. The number and arrangement of the memory pillars MP, the slits SHE, and the like between adjacent slits SLT are not limited to the configuration described with reference to FIG. 6, and may be appropriately changed. The number of bit lines BL overlapping each of the memory pillars MP may be designed to be any number.

For example, in the memory region MR, the planar layout described above is repeatedly arranged in the Y direction. A region partitioned by the slits SLT corresponds to the block BLK. In the memory region MR and in the region corresponding to the block BLK, each of the regions partitioned by the slits SLT and SHE corresponds to one string unit SU. That is, in this example, the string units SU0 to SU3 each extending in the X direction are arranged in the Y direction in each block BLK.

The planar layout in the memory region MR of the semiconductor memory device 1 according to the embodiment is not limited to the layout described above. For example, the number of slits SHE arranged between adjacent slits SLT may be designed to be any number. The number of string units SU formed between the adjacent slits SLT may be changed based on the number of slits SHE arranged between the adjacent slits SLT.

Figure 7:
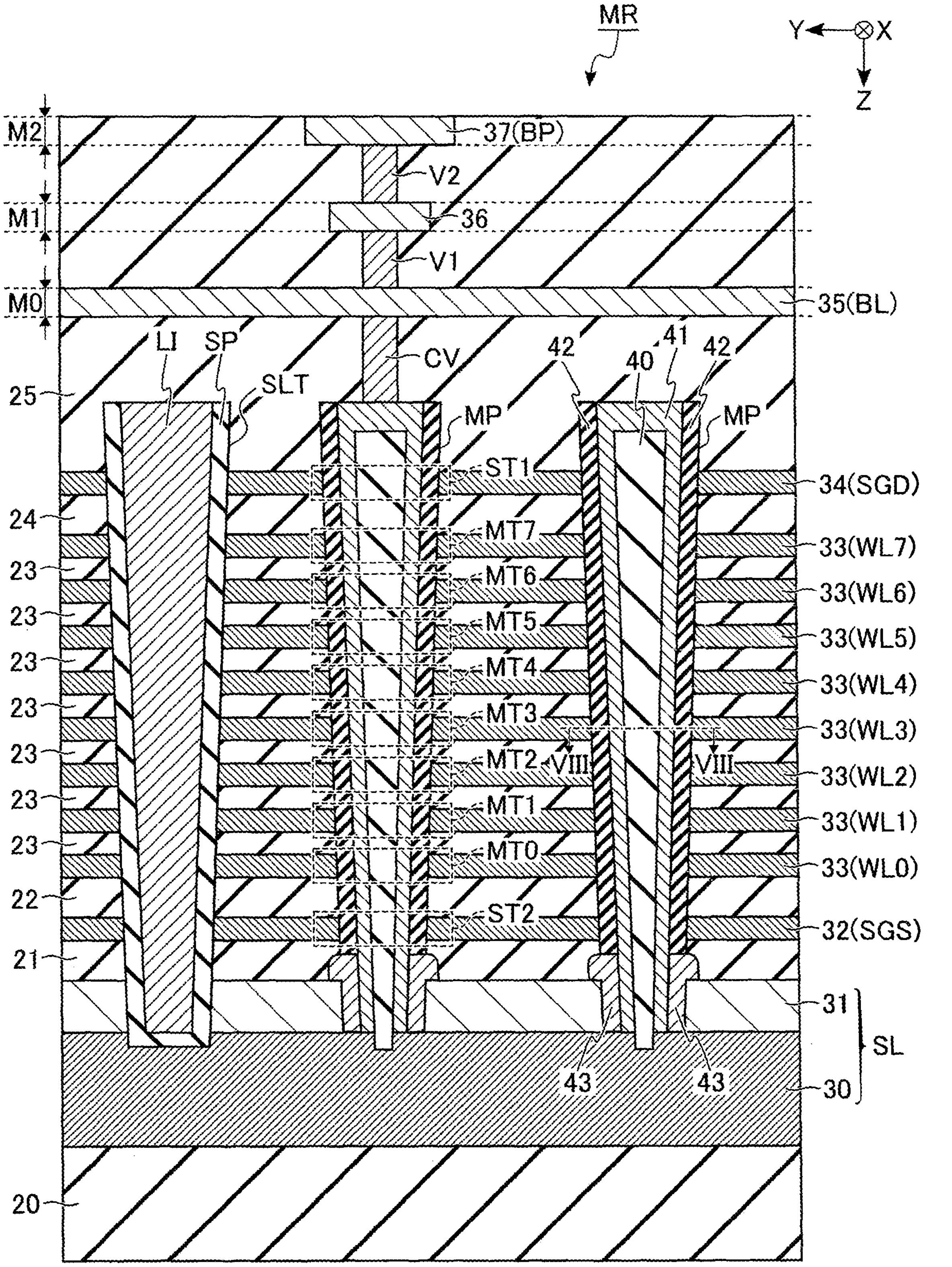
FIG. 7 is a cross-sectional view illustrating an example of a cross-sectional structure including the memory region of the semiconductor memory device according to the embodiment.

FIG. 7 illustrates an example of a cross-sectional structure in the memory region MR of the semiconductor memory device 1 according to the embodiment, and illustrates a cross section including the memory pillar MP and the slit SLT and taken along the Y direction. The Z direction in FIG. 7 is illustrated reversely with respect to FIG. 5. That is, the "top" corresponds to the lower side of the paper surface, and the "bottom" corresponds to the upper side of the paper surface. As illustrated in FIG. 7, in the memory region MR, the semiconductor memory device 1 further includes insulator layers 20 to 25, a conductor layer 30, a semiconductor layer 31, conductor layers 32 to 37, and contacts V1 and V2.

The insulator layer 20 is provided, for example, in the uppermost layer of the memory chip MC. The configuration is not limited to the above, and a wiring layer, an insulator layer, or the like may be provided on the insulator layer 20. Under the insulator layer 20, the conductor layer 30 and the semiconductor layer 31 are provided in this order. The conductor layer 30 and the semiconductor layer 31 are formed, for example, in a plate shape spreading along the XY plane, and are used as the source line SL. For example, a metal such as copper is used as the conductor layer 30. The semiconductor layer 31 contains N-type impurities at a high concentration, and includes phosphorus-doped polysilicon, for example.

The insulator layer 21 is provided under the semiconductor layer 31. The conductor layer 32 is provided under the insulator layer 21. The conductor layer 32 is formed, for example, in a plate shape spreading along the XY plane, and is used as the select gate line SGS. The select gate line SGS may include a plurality of conductor layers 32. The conductor layer 32 contains tungsten, for example. In the case where the select gate line SGS includes a plurality of types of conductor layers 32, the plurality of conductor layers 32 may include different conductors.

The insulator layer 22 is provided under the conductor layer 32. Under the insulator layer 22, the conductor layers 33 and the insulator layers 23 are provided alternately. Each of the plurality of conductor layers 33 is formed, for example, in a plate shape spreading along the XY plane. The plurality of conductor layers 33 are used as the word lines WL0 to WL7 in order from the conductor layer 30 side. The conductor layer 33 contains tungsten, for example.

The insulator layer 24 is provided under the lowermost conductor layer 33. The conductor layer 34 is provided under the insulator layer 24. The conductor layer 34 is formed, for example, in a plate shape spreading along the XY plane, and is used as the select gate line SGD. The select gate line SGD may include a plurality of conductor layers 34. The conductor layer 34 contains tungsten, for example.

The insulator layer 25 is provided under the conductor layer 34. The conductor layer 35 is provided under the insulator layer 25. The conductor layer 35 is formed, for example, in a line shape extending in the Y direction, and is used as the bit line BL. That is, in a region (not illustrated), a plurality of conductor layers 35 are arranged in the X direction. The conductor layer 35 contains copper, for example. The wiring layer on which the conductor layer 35 is provided is referred to as, for example, "M0."

Each of the memory pillars MP is provided so as to extend along the Z direction, and penetrates the insulator layers 21 to 24, the semiconductor layer 31, and the conductor layers 32 to 34. The top of the memory pillar MP is in contact with the conductor layer 30. Each of the memory pillars MP includes, for example, a core member 40, a semiconductor layer 41, a stacked film 42, and a semiconductor layer 43.

The core member 40 is provided so as to extend along the Z direction. For example, the upper end of the core member 40 is in contact with the conductor layer 30, and the lower end of the core member 40 is included in a layer below the conductor layer 34. The semiconductor layer 41 covers, for example, the side surface and the lower surface of the core member 40. The top of the semiconductor layer 41 is in contact with the conductor layer 30. The stacked film 42 covers the side surface of the semiconductor layer 41. It suffices that the stacked film 42 is provided at least between each of the conductor layers 32 to 34 and the semiconductor layer 41.

The semiconductor layer 43 is provided at least between the semiconductor layers 41 and 31, and is in contact with each of the semiconductor layers 41 and 31. The upper surface of the semiconductor layer 43 is in contact with the conductor layer 30, and the lower surface of the semiconductor layer 43 is in contact with the stacked film 42. The semiconductor layer 43 may or may not be in contact with the insulator layer 21. For example, the upper surfaces of the semiconductor layers 31, 41, and 43 are aligned. Each of the semiconductor layers 31, 41, and 43 is formed by different manufacturing processes. Therefore, a boundary can be formed between the semiconductor layers 31 and 43 and between the semiconductor layers 41 and 43.

The core member 40 includes an insulator such as silicon oxide. The semiconductor layers 41 and 43 are non-doped silicon, for example. A portion where the memory pillar MP intersects the conductor layer 32 (select gate line SGS)

functions as the select transistor ST2. A portion where the memory pillar MP intersects the conductor layer (word line WL) functions as the memory cell transistor MT. A portion where the memory pillar MP intersects the conductor layer 34 (select gate line SGD) functions as the select transistor ST1.

A columnar contact CV is provided under the semiconductor layer 41 of each of the memory pillars MP. In the illustrated region, the contact CV corresponding to one of the two memory pillars MP is illustrated. To the memory pillar MP to which the contact CV is not connected in the region, the contact CV is connected in a region not illustrated. Under the contact CV, one conductor layer 35 (bit line BL) is in contact.

A columnar contact V1 is provided under the conductor layer 35. A conductor layer 36 is provided under the contact V1. The conductor layer 36 is a wiring used for connection of the circuit in the semiconductor memory device 1. The wiring layer on which the conductor layer 36 is provided is referred to as, for example, "M1."

A columnar contact V2 is provided under the conductor layer 36. A conductor layer 37 is provided under the contact V2. The conductor layer 37 is in contact with the interface of the memory chip MC and is used as the bonding pad BP. The conductor layer 37 contains copper, for example. The wiring layer on which the conductor layer 37 is provided is referred to as, for example, "M2."

The slit SLT is formed in a plate shape at least partially spreading along the XZ plane, and divides the insulator layers 21 to 24, the semiconductor layer 31, and the conductor layers 32 to 34. The lower end of the slit SLT is included in the layer including the insulator layer 25. The upper end of the slit SLT is in contact with the conductor layer 30. The side surface and the upper surface of the contact LI are covered with a spacer SP. In this manner, the contact LI is separated and insulated from each of the conductor layer 30, the semiconductor layer 31, and the conductor layers 32 to 34 by the spacer SP.

Figure 8:
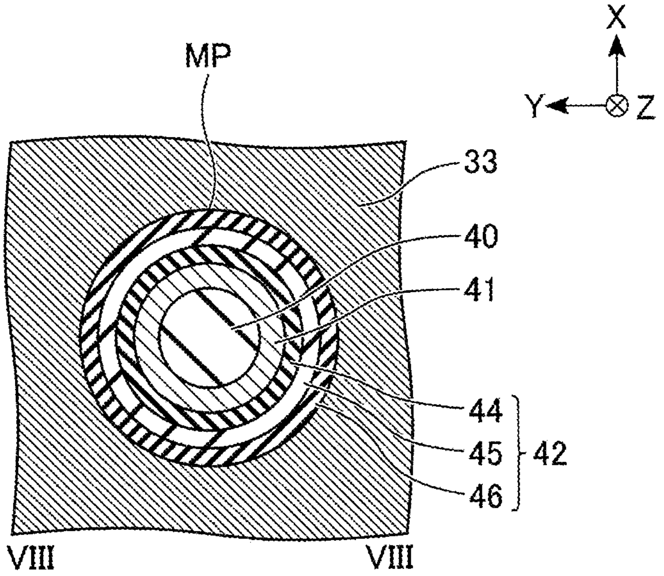
FIG. 8 is a cross-sectional view taken along line VIII-VIII in FIG. 7 and illustrates an example of a cross-sectional structure of a memory pillar in the semiconductor memory device according to the embodiment.

FIG. 8 is a cross-sectional view taken along line VIII-VIII in FIG. 7, and illustrates an example of a cross-sectional structure of the memory pillar MP in the semiconductor memory device 1 according to the embodiment. Specifically, FIG. 8 illustrates a cross section that includes the memory pillar MP and the conductor layer 33 and is parallel to the substrate of the semiconductor memory device 1.

As illustrated in FIG. 8, the stacked film 42 includes, for example, a tunnel insulating film 44, an insulating film 45, and a block insulating film 46. In the layer including the conductor layer 33, the core member 40 is provided, for example, at the central portion of the memory pillar MP. The semiconductor layer 41 surrounds the side surface of the core member 40. The tunnel insulating film 44 surrounds the side surface of the semiconductor layer 41. The insulating film 45 surrounds the side surface of the tunnel insulating film 44. The block insulating film 46 surrounds the side surface of the insulating film 45. The conductor layer 33 surrounds the side surface of the block insulating film 46.

The semiconductor layer 41 is used as a channel (current path) of the memory cell transistors MT0 to MT7 and the select transistors ST1 and ST2. Each of the tunnel insulating film 44 and the block insulating film 46 contains silicon oxide, for example. The insulating film 45 is used as a charge storage layer of the memory cell transistor MT, and includes silicon nitride, for example. With this configuration, each of the memory pillars MP functions as one NAND string NS.

Figure 9:
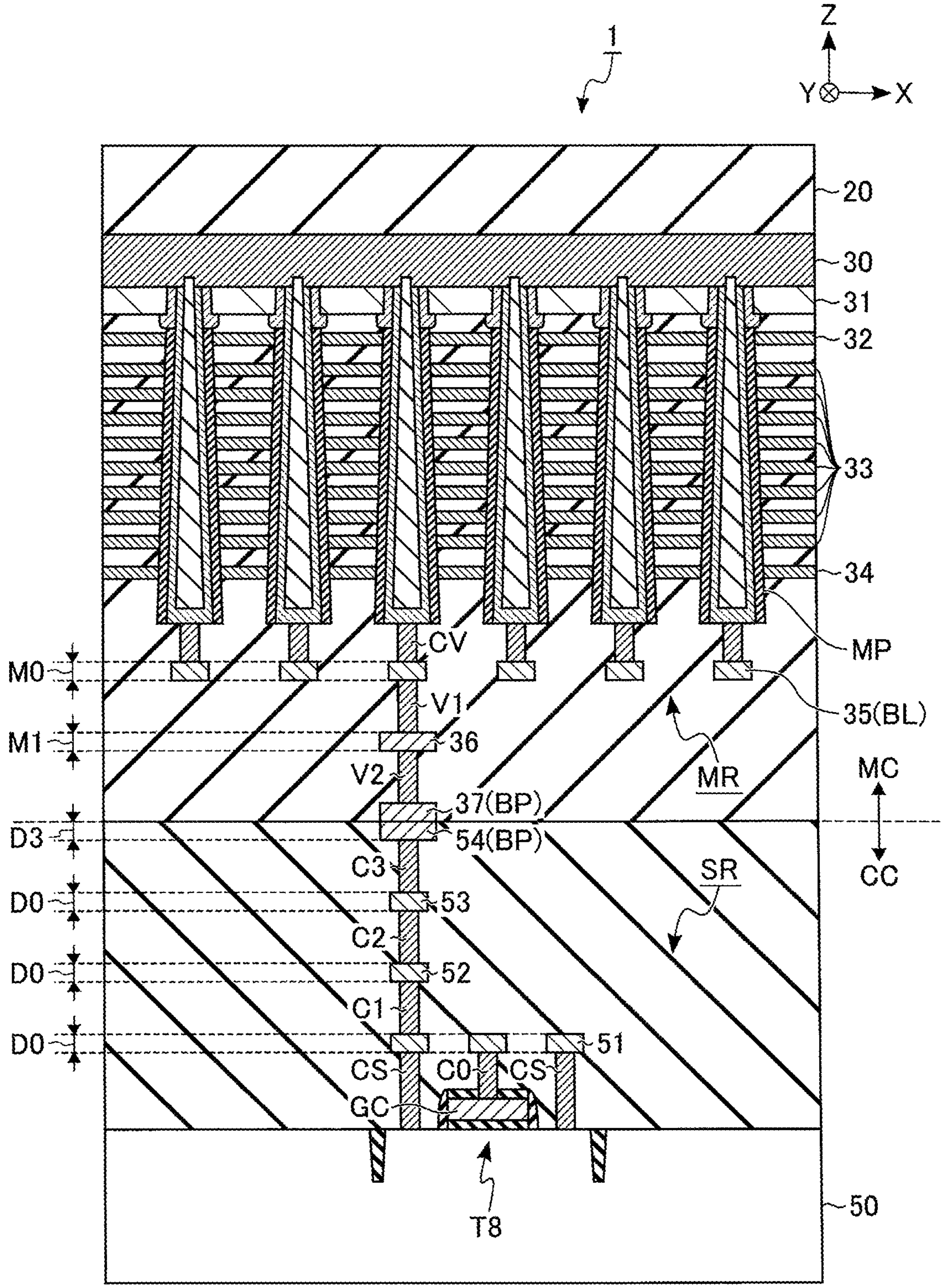
FIG. 9 is a cross-sectional view illustrating an example of a cross-sectional structure including the memory region and a sense amplifier region of the semiconductor memory device according to the embodiment.

<1-3-3> Structure of the Semiconductor Memory Device 1 in the Sense Amplifier Region SR FIG. 9 illustrates an example of a cross-sectional structure in the sense amplifier region SR of the semiconductor memory device 1 according to the embodiment, and illustrates a structure in which the memory chip MC and the CMOS chip CC are bonded to each other. In addition, FIG. 9 illustrates a configuration corresponding to the transistor T8 included in the sense amplifier unit SAU. As illustrated in FIG. 9, the CMOS chip CC includes, for example, a semiconductor substrate 50, conductor layers GC and 51 to 54, and columnar contacts CS and C0 to C3.

The semiconductor substrate 50 is used for formation of the CMOS chip CC, and contains P-type impurities, for example. In addition, the semiconductor substrate 50 includes a plurality of well regions (not illustrated). For example, a transistor is formed in each of the plurality of well regions. The plurality of well regions are separated by STI (Shallow Trench Isolation), for example.

In the sense amplifier region SR, a conductor layer GC is provided on the semiconductor substrate 50 via a gate insulating film. The conductor layer GC in the sense amplifier region SR is used, for example, as a gate electrode of the transistor T8 included in the sense amplifier unit SAU. A contact C0 is provided on the conductor layer GC so as to correspond to the gate of the transistor T8, and two contacts CS are provided on the semiconductor substrate 50 so as to correspond to the source and the drain of the transistor T8. For example, the upper surfaces of the contacts CS and C0 are aligned.

Furthermore, in the sense amplifier region SR, one conductor layer 51 is provided on each of the contact CS and the contact C0. A contact C1 is provided on the conductor layer 51. A conductor layer 52 is provided on the contact C1. A contact C2 is provided on the conductor layer 52. A conductor layer 53 is provided on the contact C2. A contact C3 is provided on the conductor layer 53. A conductor layer 54 is provided on the contact C3.

The conductor layer 54 is in contact with the interface of the CMOS chip CC and is used as the bonding pad BP. The conductor layer 54 in the sense amplifier region SR is bonded to the conductor layer 37 (the bonding pad BP of the memory chip MC) in the memory region MR arranged opposite, and is electrically connected to one bit line BL. The conductor layer 54 contains copper, for example. Although not illustrated, the sense amplifier region SR includes a plurality of transistors having the same structure as the transistor T8.

For example, the wiring layers provided with the conductor layers 51 to 54 are referred to as "D0," "D1," "D2," and "D3," respectively. The number of wiring layers provided in the CMOS chip CC may be designed to be any number. In addition, the contact connected to each of the conductor layers 51 to 53 may be omitted according to the design of the circuit. The layout of the wiring for connecting the circuit in the memory chip MC and the circuit in the CMOS chip CC may be appropriately changed.

<2> Manufacturing Method

Figure 10:
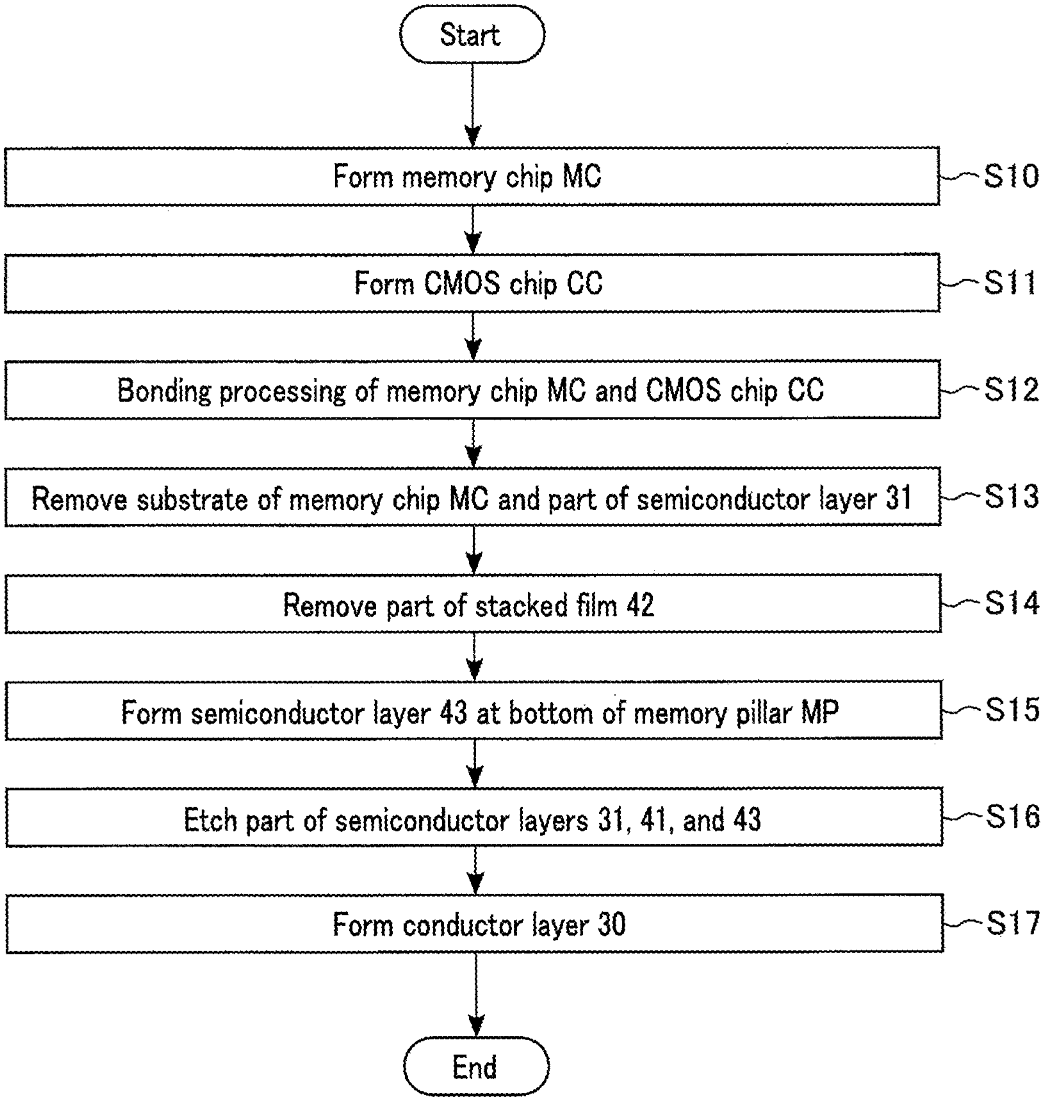
FIG. 10 is a flowchart illustrating an example of a manufacturing method of the semiconductor memory device according to the embodiment.

Hereinafter, a method for forming the source line SL in the semiconductor memory device 1 according to the embodiment will be described with reference to FIGS. 10 to 16. FIG. 10 illustrates an example of a flow of a method of forming the source line SL in the semiconductor memory device 1 according to the embodiment. FIGS. 11 to 16 illustrate an example of a cross-sectional structure of the semiconductor memory device 1 according to the embodiment in the manufacturing process, and extract a region including the memory pillar MP for illustration.

First, the memory chip MC is formed (step S10), and the CMOS chip CC is formed (step S11). Since the memory chip MC and the CMOS chip CC are formed using different semiconductor substrates, the step of forming the memory chip MC and the step of forming the CMOS chip CC may be interchanged or may be performed in parallel.

Figure 11:
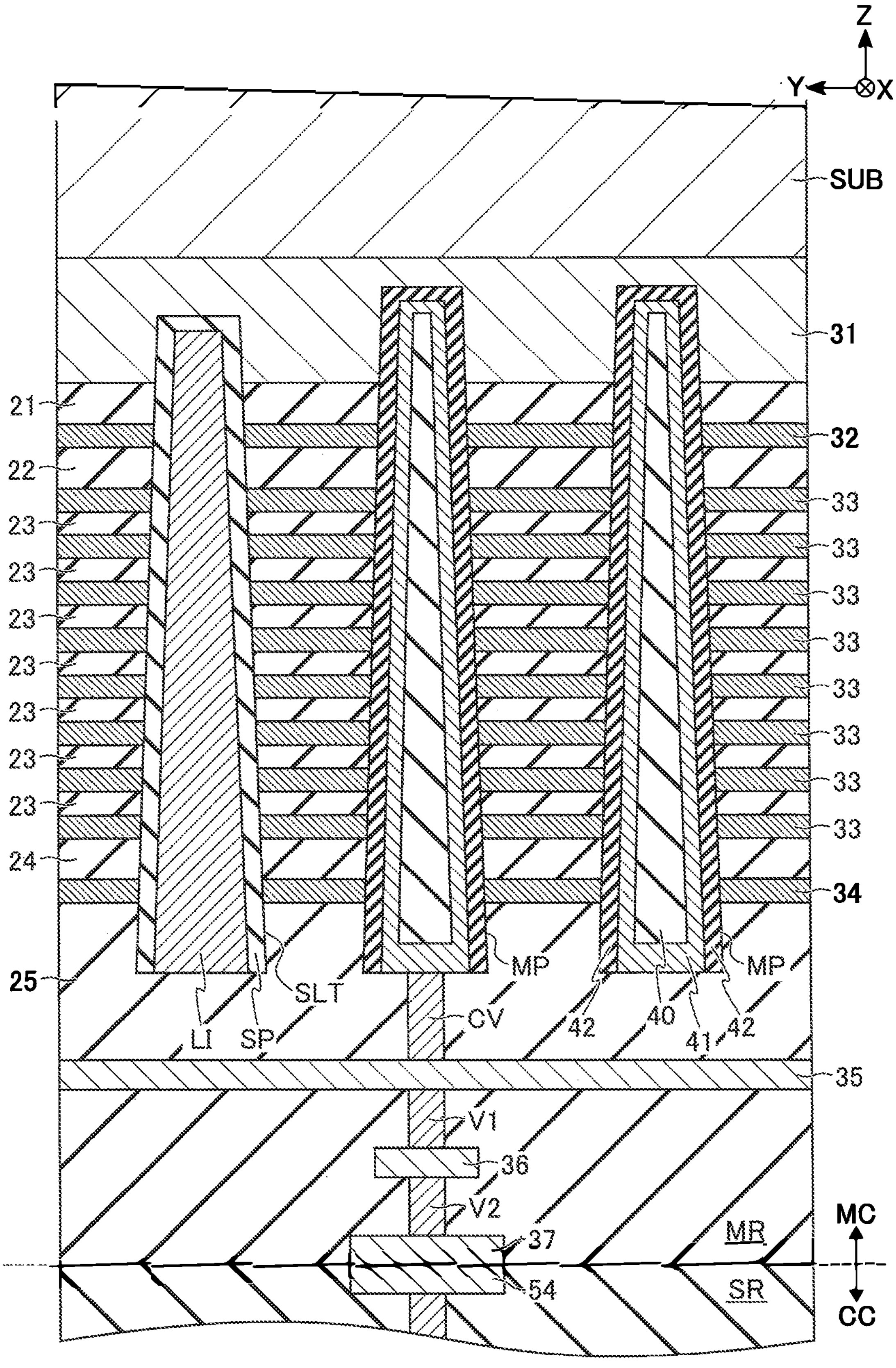
FIG. 11 is a cross-sectional view illustrating an example of a cross-sectional structure of the semiconductor memory device according to the embodiment in a manufacturing process.

As illustrated in FIG. 11, the memory chip MC and the CMOS chip CC are bonded to each other by bonding processing between the memory chip MC and the CMOS chip CC (step S12). Specifically, the bonding pad BP exposed on the memory chip MC and the bonding pad BP exposed on the CMOS chip CC are arranged so as to face each other. Then, the facing bonding pads BP are bonded to each other by heat treatment.

The semiconductor substrate SUB illustrated in FIG. 11 corresponds to the substrate of the memory chip MC. At this time, for example, the semiconductor layer 31 is provided on the lower surface of semiconductor substrate SUB. The semiconductor layer 31 covers each of the bottom of the memory pillar MP and the bottom of the slit SLT. The memory pillar MP has a structure in which the stacked film 42, the semiconductor layer 41, and the core member 40 are sequentially formed in a hole. Therefore, when the memory chip MC and the CMOS chip CC are bonded, the semiconductor layer 41 in the memory pillar MP and the semiconductor layer are separated by the stacked film 42 and are not electrically connected.

Figure 12:
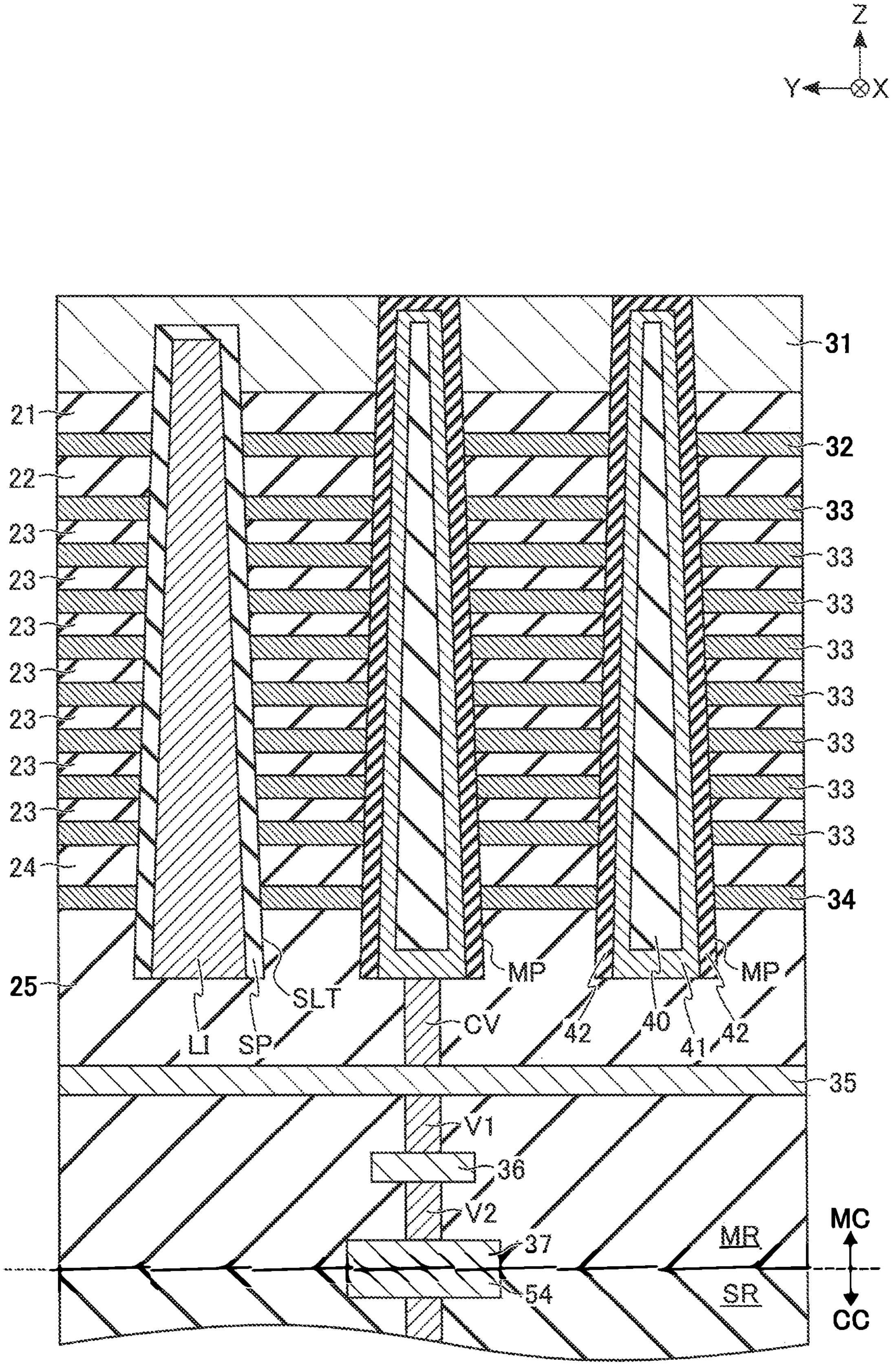
FIG. 12 is a cross-sectional view illustrating an example of a cross-sectional structure of the semiconductor memory device according to the embodiment in the manufacturing process.

Next, as illustrated in FIG. 12, the semiconductor substrate SUB of the memory chip MC and a part of the semiconductor layer 31 are removed (step S13). Specifically, first, the semiconductor substrate SUB of the memory chip MC is removed by chemical mechanical polishing (CMP) or the like. This CMP is stopped when the stacked film 42 at the bottom of the memory pillar MP is detected. As a result, a structure is formed in which the stacked film 42 at the bottom of the memory pillar MP is exposed from the surface of the semiconductor layer 31.

Figure 13:
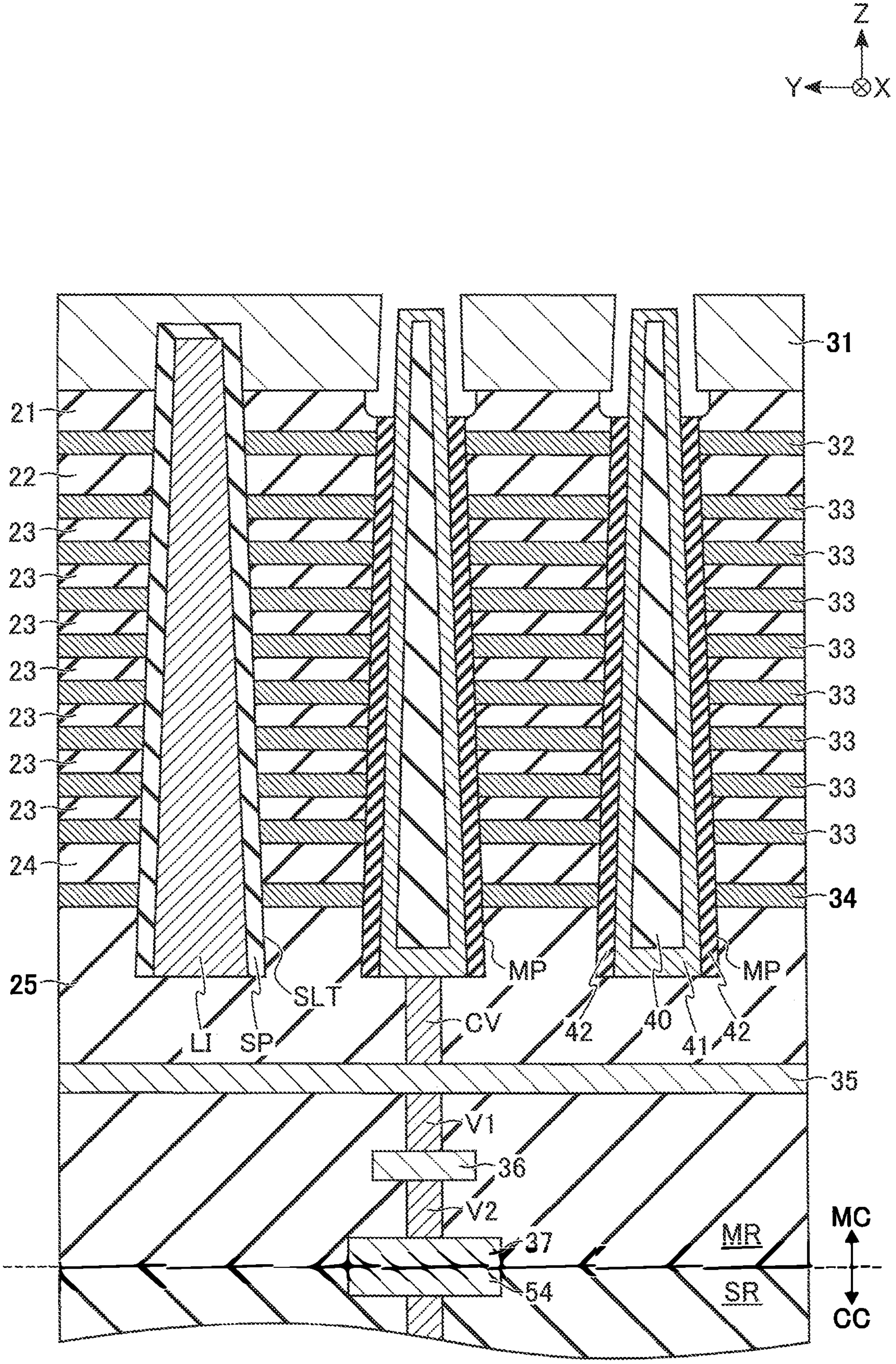
FIG. 13 is a cross-sectional view illustrating an example of a cross-sectional structure of the semiconductor memory device according to the embodiment in the manufacturing process.

Next, as illustrated in FIG. 13, a part of the stacked film 42 is removed (step S14). Specifically, wet etching is performed using a condition that can selectively remove the stacked film 42. In this wet etching, it is preferable to remove the stacked film 42 between the semiconductor layers 31 and 42. This wet etching may etch a part of the insulator layer 21, and it suffices that at least the conductor layer 32 is not reached.

Figure 14:
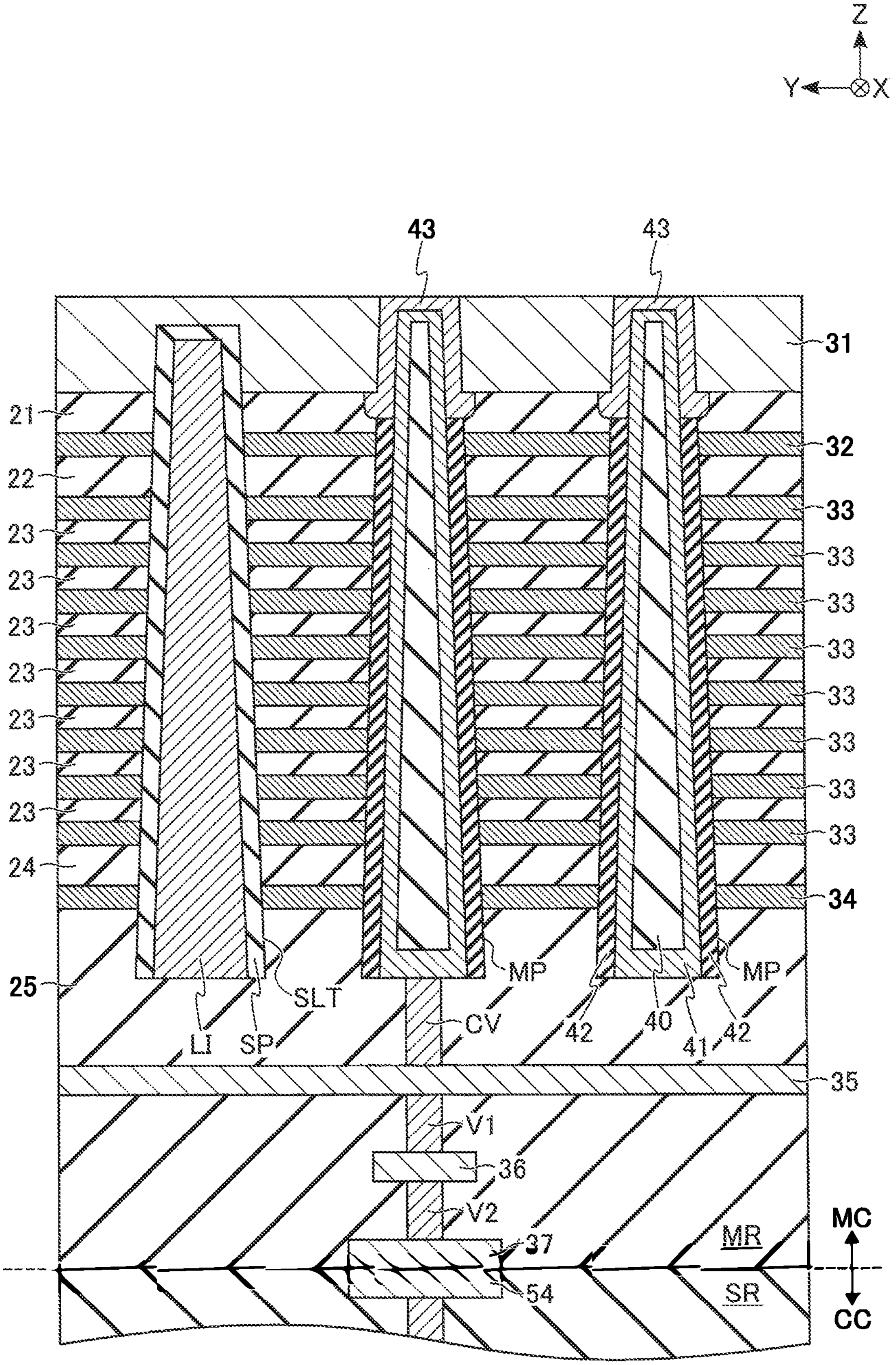
FIG. 14 is a cross-sectional view illustrating an example of a cross-sectional structure of the semiconductor memory device according to the embodiment in the manufacturing process.

Next, as illustrated in FIG. 14, the semiconductor layer 43 is formed at the bottom of the memory pillar MP (step S15). Specifically, the semiconductor layer 43 is formed by, for example, chemical vapor deposition (CVD) or the like so as to fill the space where the stacked film 42 has been removed. Then, for example, the semiconductor layer 43 formed outside the space where the stacked film 42 has been removed is removed by CMP. As a result, a structure is formed in which the semiconductor layer 41 and the semiconductor layer 31 are connected via the semiconductor layer 43.

Figure 15:
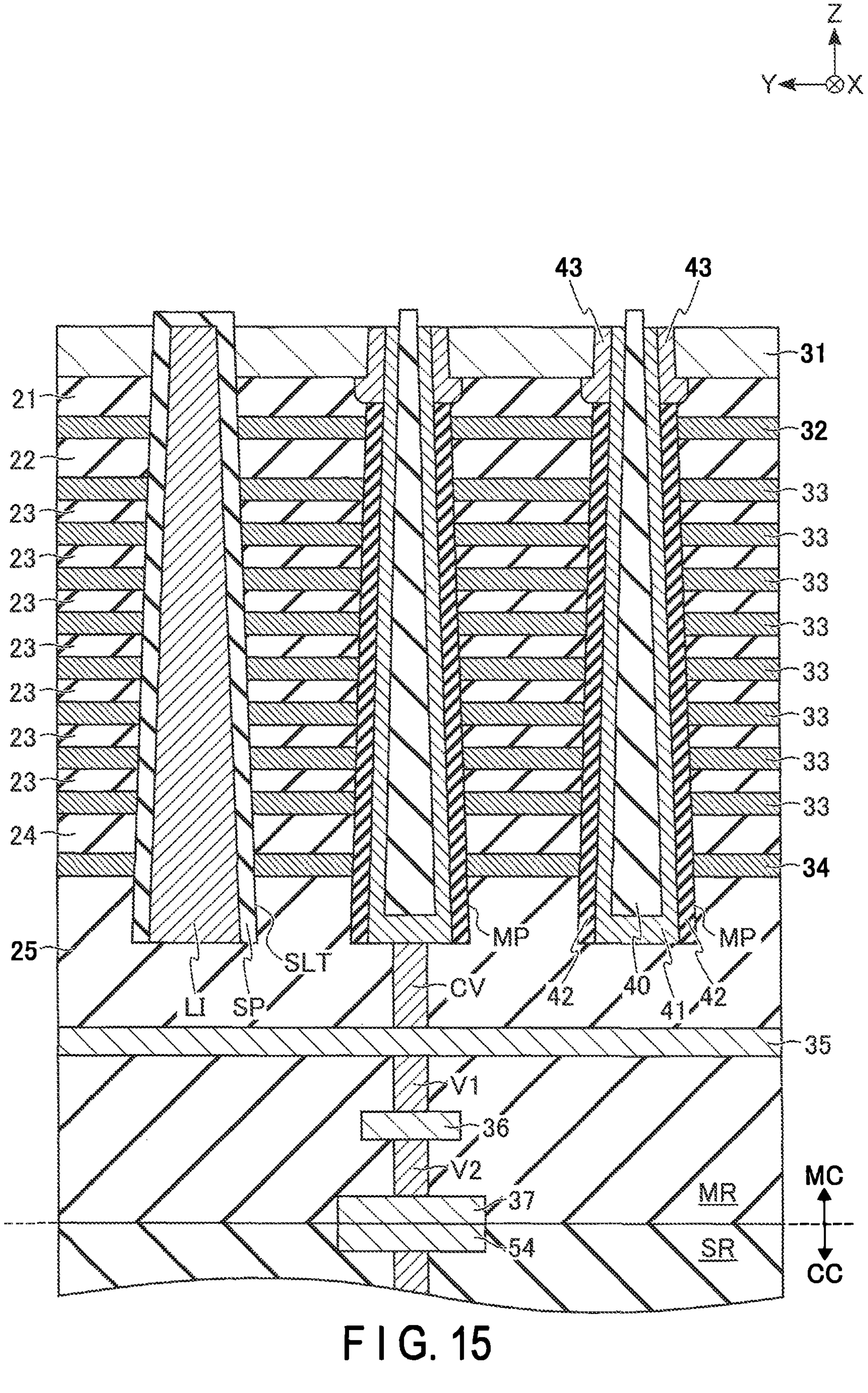
FIG. 15 is a cross-sectional view illustrating an example of a cross-sectional structure of the semiconductor memory device according to the embodiment in the manufacturing process.

Next, as illustrated in FIG. 15, portions of the semiconductor layers 31, 41, and 43 are etched (step S16). Specifically, for example, dry etching is performed using a condition that can selectively remove the semiconductor layers 31, 41, and 43. In this dry etching, for example, the semiconductor layers 41 and 43 provided on the bottom surface of the memory pillar MP are removed, and the bottom of the core member 40 is exposed. In addition, the spacer SP at the bottom of the slit SLT is similarly exposed. This etching is performed to leave at least the semiconductor layer 31.

Figure 16:
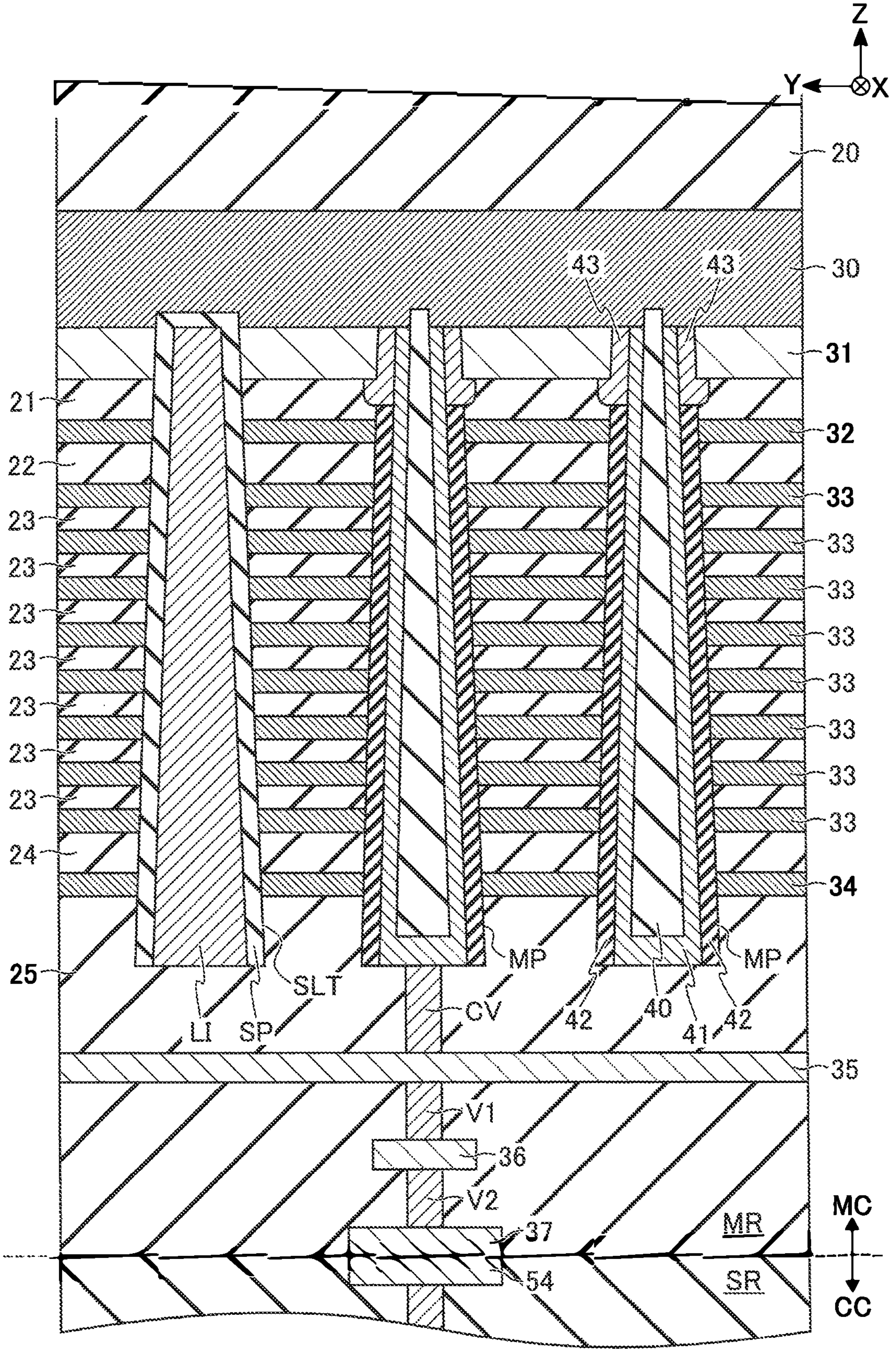
FIG. 16 is a cross-sectional view illustrating an example of a cross-sectional structure of the semiconductor memory device according to the embodiment in the manufacturing process.

Next, as illustrated in FIG. 16, the conductor layer 30 is formed (step S17). As a result, the source line SL is formed having a structure in which the conductor layer 30 is in contact with each of the semiconductor layers 31, 41, and 43 and the spacer SP at the bottom of the slit SLT. Then, the insulator layer 20 is formed on the conductor layer 30, and processes related to formation of the contact connected to the source line SL and formation of the pad are appropriately performed.

Through the manufacturing process of the semiconductor memory device 1 according to the embodiment described above, a structure that electrically connects the source line SL and the semiconductor layer 41 in the memory pillar MP can be formed. Note that the manufacturing process described above is merely an example, and other processes may be inserted between the manufacturing processes.

<3> Operation

Figure 17:
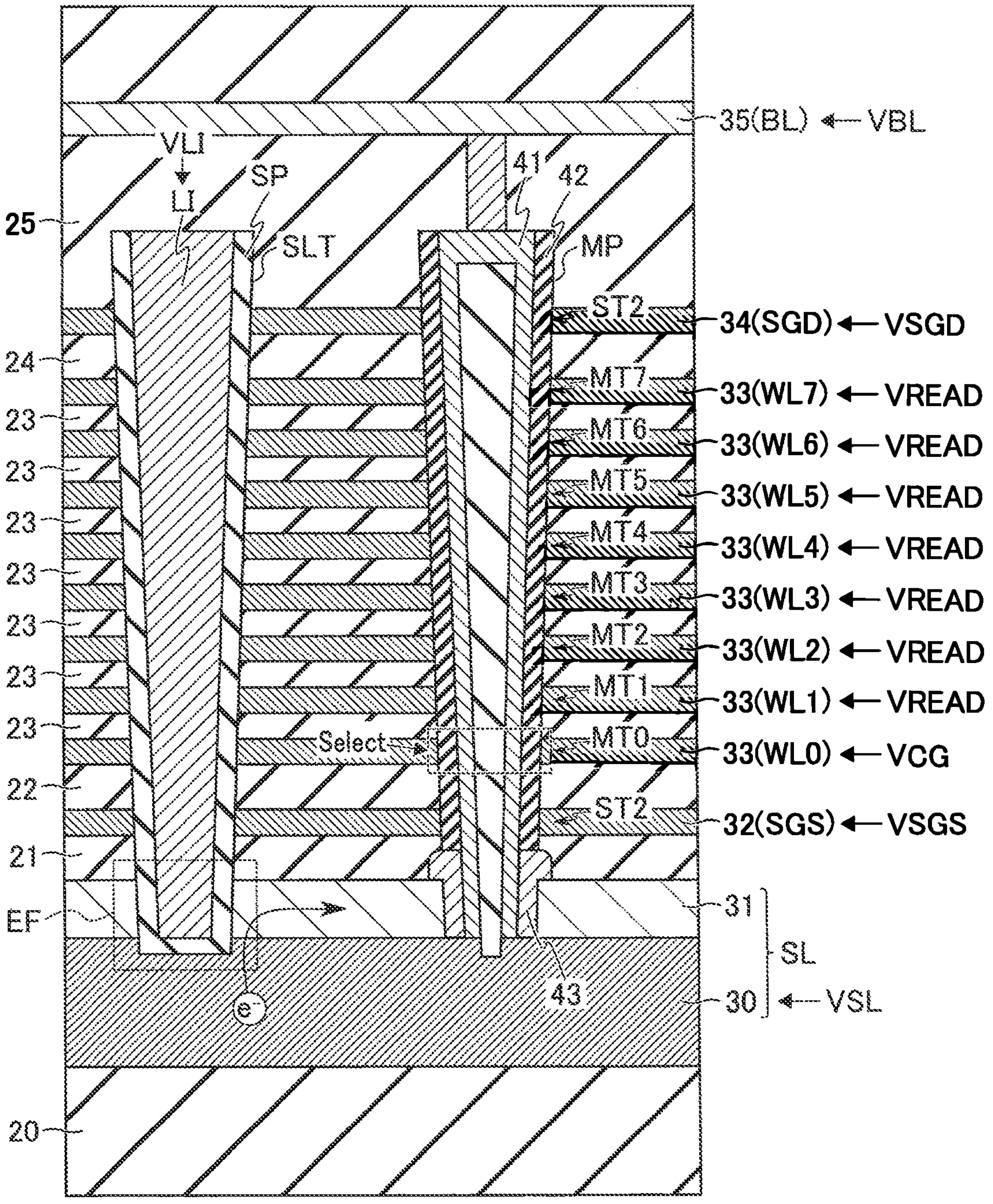
FIG. 17 is a schematic diagram illustrating an example of a voltage used in a read operation of the semiconductor memory device according to the embodiment.

Hereinafter, an example of operation in the semiconductor memory device 1 according to the embodiment will be described using the read operation as a representative. FIG. 17 illustrates a cross-sectional structure including the memory pillar MP and the slit SLT of the semiconductor memory device 1 according to the embodiment, and also illustrates an example of voltages used in the read operation. Hereinafter, the voltages applied to the wiring are indicated only by reference characters.

This example corresponds to a case where the memory cell transistor MT0 connected to the word line WL0 is selected. In the read operation, for example, voltages illustrated in FIG. 17 are applied to respective wirings. Specifically, VSL is applied to the conductor layer 30 of the source line SL. VCG is applied to the selected word line WL0. VREAD is applied to each of the unselected word lines WL1 to WL7. VSGS is applied to the select gate line SGS. VSGD is applied to the select gate line SGD. VBL is applied to the bit line. VLI is applied to the contact LI in the slit SLT.

The VSL is a ground voltage, for example. The VCG is a read voltage for determining data stored in the memory cell transistor MT. In this example, it is assumed that the memory cell transistor MT0 to which the VCG is applied is turned on. The VREAD is a voltage that turns on the memory cell transistor MT regardless of the stored data. The VSGD and VSGS are voltages that turn on the select transistors ST1 and ST2 of the selected block BLK, respectively, in the read operation. The VBL is, for example, a voltage higher than the ground voltage. The VLI is, for example, a voltage higher than the ground voltage.

When the above-described voltages are applied, the memory cell transistors MT0 to MT7 and the select transistors ST1 and ST2 are turned on. This causes a channel to be formed in the semiconductor layer 41 in the memory pillar MP. In addition, when the VSGS is applied to the conductor layer 32 adjacent to the semiconductor layer 31, an inversion layer is formed in the semiconductor layers 41 and 43, and functions as a channel of the NAND string NS. Furthermore, when the VLI is applied to the contact LI, a region EF to which a positive electric field is applied is formed at the bottom of the slit SLT. Then, in the region EF, the barrier between the conductor layer 30 (metal) and the semiconductor layer 31 is lowered. As a result, electrons are supplied from the conductor layer 30 to the semiconductor layer 31 via the region EF.

As described above, the semiconductor memory device 1 according to the embodiment reduces the resistance between the conductor layer 30 and the semiconductor layer 31 by applying the VLI to the contact LI. Such an operation may also be applied to the write operation and the erase operation. That is, the VLI may be applied to the contact LI when a voltage is applied to the source line SL during various operations. The timing for applying the voltage to the contact LI and the magnitude of the VLI may be changed for each operation in which the source line SL is used, or may be appropriately changed.

<4> Effects of the Embodiment

In the semiconductor memory device 1 according to the embodiment described above, it is possible to improve the yield of the semiconductor memory device 1. Hereinafter, a detailed effect of the semiconductor memory device 1 according to the embodiment will be described.

The semiconductor memory device in which memory cells are three-dimensionally stacked includes, for example, a plurality of stacked word lines WL and memory pillars MP penetrating the plurality of word lines WL. In such a semiconductor memory device, for example, processing of removing the stacked film 42 provided at the bottom of a hole for forming the memory pillar MP (hereinafter, referred to as a memory hole) is performed to connect the semiconductor layer 41 used as the channel in the memory pillar MP and the source line SL.

However, the difficulty of the processing of removing the stacked film 42 provided at the bottom of the memory hole increases as the number of stacked word lines WL is increased to improve the storage capacity. A method of connecting the semiconductor layer 41 and the source line SL via the side surface of the memory pillar MP is also considered, but the processing difficulty is high as in the case of removing the stacked film 42 provided at the bottom of the memory hole. In addition, such a method can also lead to an increase in manufacturing cost associated with an increase in the number of processes.

As another method of increasing the storage capacity per unit area, a structure is conceivable in which the memory cell array 10 and the peripheral circuit are formed on different semiconductor substrates and then the two semiconductor substrates are bonded (hereinafter, referred to as a bonding structure). The bonding structure can increase the occupancy of the memory cell array 10 with respect to the chip area of the semiconductor memory device, and can further reduce the restriction on the process for each semiconductor substrate. In addition, in the case where the memory chip provided with the memory cell array 10 is arranged on the CMOS chip provided with the peripheral circuit in the bonding structure, the bottom of the memory pillar MP is arranged on the upper surface side of the chip of the semiconductor memory device.

Thus, the semiconductor memory device 1 according to the embodiment has a structure in which the memory pillar MP and the source line SL are connected after the memory chip MC and the CMOS chip CC are bonded. Briefly, when the memory chip MC is formed, the semiconductor layer 31 used as a part of the source line SL is formed, but the connection between the semiconductor layer 41 and the semiconductor layer 31 in the memory pillar MP is omitted. Then, after the memory chip MC and the CMOS chip CC are bonded, a part of the stacked film 42 in the memory pillar MP is removed from the upper surface side of the chip, and the semiconductor layer 43 connecting the semiconductor layer 31 and the semiconductor layer 41 in the memory pillar MP is formed.

Processing the bottom of the memory pillar MP from the upper surface side of the chip in this manner means shallow etching. Therefore, in the semiconductor memory device 1 according to the embodiment, the difficulty of etching to connect the semiconductor layers 31 and 41 becomes lower than the process of removing the stacked film 42 provided at the bottom of the memory hole at the time of the formation of the memory chip MC.

As a result, the semiconductor memory device 1 according to the embodiment can suppress the occurrence of a defect due to processing to connect the source line SL and the semiconductor layer 41 in the memory pillar MP. Accordingly, the semiconductor memory device 1 according to the embodiment can improve the yield.

In addition, the semiconductor memory device 1 according to the embodiment has a structure in which the semiconductor layer 31 containing high-concentration N-type impurities and the metal conductor layer 30 on the semiconductor layer 31 are provided to reduce the wiring resistance of the source line SL. Non-doped silicon is used as the semiconductor layer 43 connecting the semiconductor layer 31 and the semiconductor layer 41.

When the semiconductor layer is doped with impurities, a heat treatment for activating the doped impurities (hereinafter, referred to as annealing) is performed. However, annealing performed after bonding the memory chip MC and the CMOS chip CC may cause the degradation in performance of the transistor of the peripheral circuit, the occurrence of defects due to diffusion of a specific metal (for example, copper), and the like. Therefore, it is preferable that annealing is not performed after bonding the memory chip MC and the CMOS chip CC.

On the other hand, in the semiconductor memory device 1 according to the embodiment, the process of forming the semiconductor layer doped with impurities can be performed only when the memory chip MC is formed. Then, the formation of the semiconductor layer and the metal wiring after the memory chip MC and the CMOS chip CC are bonded can be limited to processing that does not require annealing. As a result, the semiconductor memory device 1 according to the embodiment can suppress the deterioration in performance of the transistor of the CMOS chip CC, the occurrence of defects due to annealing, and the like.

In the method for manufacturing the semiconductor memory device 1 described above, it is also conceivable to form silicon corresponding to the source line SL after removing the whole semiconductor layer 31 when forming the structure of the source line SL after bonding the memory chip MC and the CMOS chip CC. In such a manufacturing method, it is easy to manage the layer where etching is stopped, and thus the difficulty of the etching process can be reduced.

However, in such a manufacturing method, since the semiconductor layer 31 doped with the N-type impurities is removed, the wiring resistance of the source line SL may be increased. It is not preferable to form the semiconductor layer 31 containing the N-type impurities after bonding the memory chip MC and the CMOS chip CC, for example, because annealing described above is required.

To counter this, in the semiconductor memory device 1 according to the embodiment, a part of the stacked film 42 in the memory pillar MP is removed, and the non-doped semiconductor layer 43 is provided in the region where the stacked film 42 has been removed. Thus, in the semiconductor memory device 1 according to the embodiment, the amount of the non-doped semiconductor layer 43 used for the connection between the semiconductor layer 41 in the memory pillar MP and the semiconductor layer 31 doped with the N-type impurities can be minimized. As a result, the semiconductor memory device 1 according to the embodiment can realize a structure capable of reducing the wiring resistance of the source line SL and electrically connecting with the semiconductor layer 41 in the memory pillar MP at low cost.

When the conductor layer 30 is used as a part of the source line SL, the Schottky barrier may increase the resistance between the metal conductor layer 30 and the semiconductor layer 31. To counter this, the semiconductor memory device 1 according to the embodiment includes the slit SLT that penetrates or divides the semiconductor layer and is in contact with the conductor layer 30. In addition, the slit SLT includes a contact LI insulated from the conductor layer 30 and the semiconductor layer 31 by the spacer SP.

The semiconductor memory device 1 according to the embodiment has a configuration capable of applying a voltage to the contact LI provided in the slit SLT. Then, the semiconductor memory device 1 according to the embodiment applies a positive voltage to the contact LI during various operations, making it possible to reduce the resistance between the conductor layer 30 and the semiconductor layer 31. As a result, the semiconductor memory device 1 according to the embodiment can reduce the wiring resistance of the source line SL.

<5> Modification of the Embodiment

The configuration of the semiconductor memory device 1 according to the embodiment described above may be variously modified. Hereinafter, a first modification, a second modification, and a third modification of the embodiment will be described in order.

(First Modification)

Figure 18:
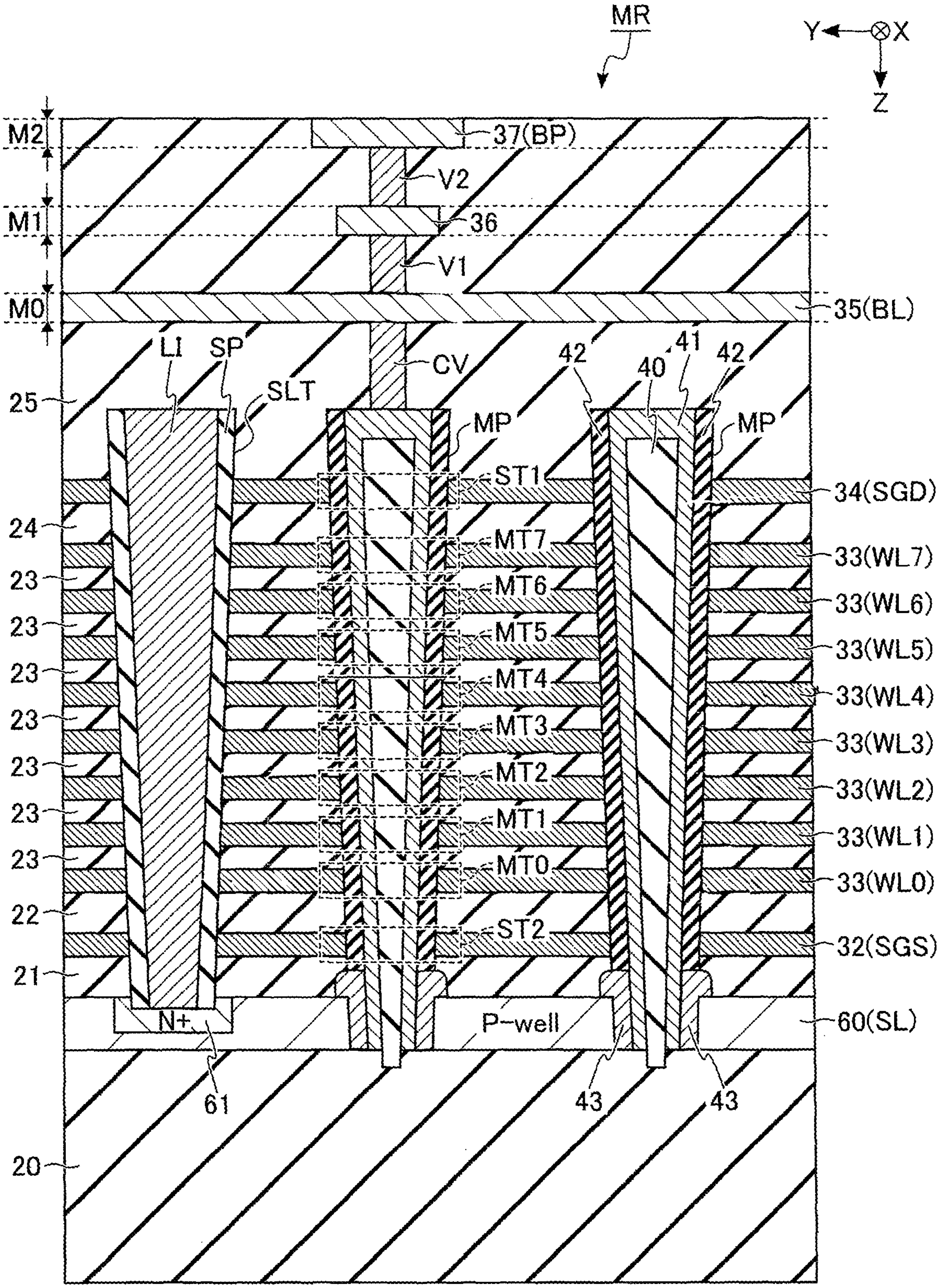
FIG. 18 is a cross-sectional view illustrating an example of a cross-sectional structure including a memory region of a semiconductor memory device according to a first modification of the embodiment.

FIG. 18 illustrates an example of a cross-sectional structure in a memory region MR of a semiconductor memory device 1 according to the first modification of the embodiment, and illustrates the same region as in FIG. 7. As illustrated in FIG. 18, the semiconductor memory device 1 according to the first modification of the embodiment is different from the semiconductor memory device 1 according to the embodiment in the structure of the source line SL and the structure of the slit SLT.

Specifically, the semiconductor memory device 1 according to the first modification of the embodiment has a configuration in which the conductor layer 30 is omitted and the semiconductor layer 31 is replaced with a semiconductor layer 60, as compared with the semiconductor memory device 1 according to the embodiment. The semiconductor layer 60 is, for example, a P-type well region (P-well) formed on the semiconductor substrate SUB of the memory chip MC. That is, in the first modification of the embodiment, a part of the semiconductor substrate SUB of the memory chip MC remains.

In addition, the semiconductor layer 60 includes an N-type diffusion region 61. The N-type diffusion region 61 is arranged at the bottom of the slit SLT and is in contact with the slit SLT. In the first modification of the embodiment, the spacer SP at the bottom of the slit SLT is removed, and the contact LI is in contact with the N-type diffusion region 61. That is, the contact LI is electrically connected to the semiconductor layer 60 via the N-type diffusion region 61. Thus, in the first modification of the embodiment, the contact LI is used as a wiring for applying a voltage to the source line SL. Other structures of the semiconductor memory device 1 according to the first modification of the embodiment are the same as those of the embodiment.

As described above, the semiconductor memory device 1 according to the first modification of the embodiment has a structure in which a voltage is applied to the source line SL via the contact LI. Even in such a case, the semiconductor memory device 1 according to the first modification of the embodiment can electrically connect the source line SL and the memory pillar MP by forming the semiconductor layer 43 between the semiconductor layer 41 in the memory pillar MP and the semiconductor layer 60 after bonding the memory chip MC and the CMOS chip CC. As a result, the semiconductor memory device 1 according to the first modification of the embodiment can improve the yield similarly to the embodiment.

(Second Modification)

Figure 19:
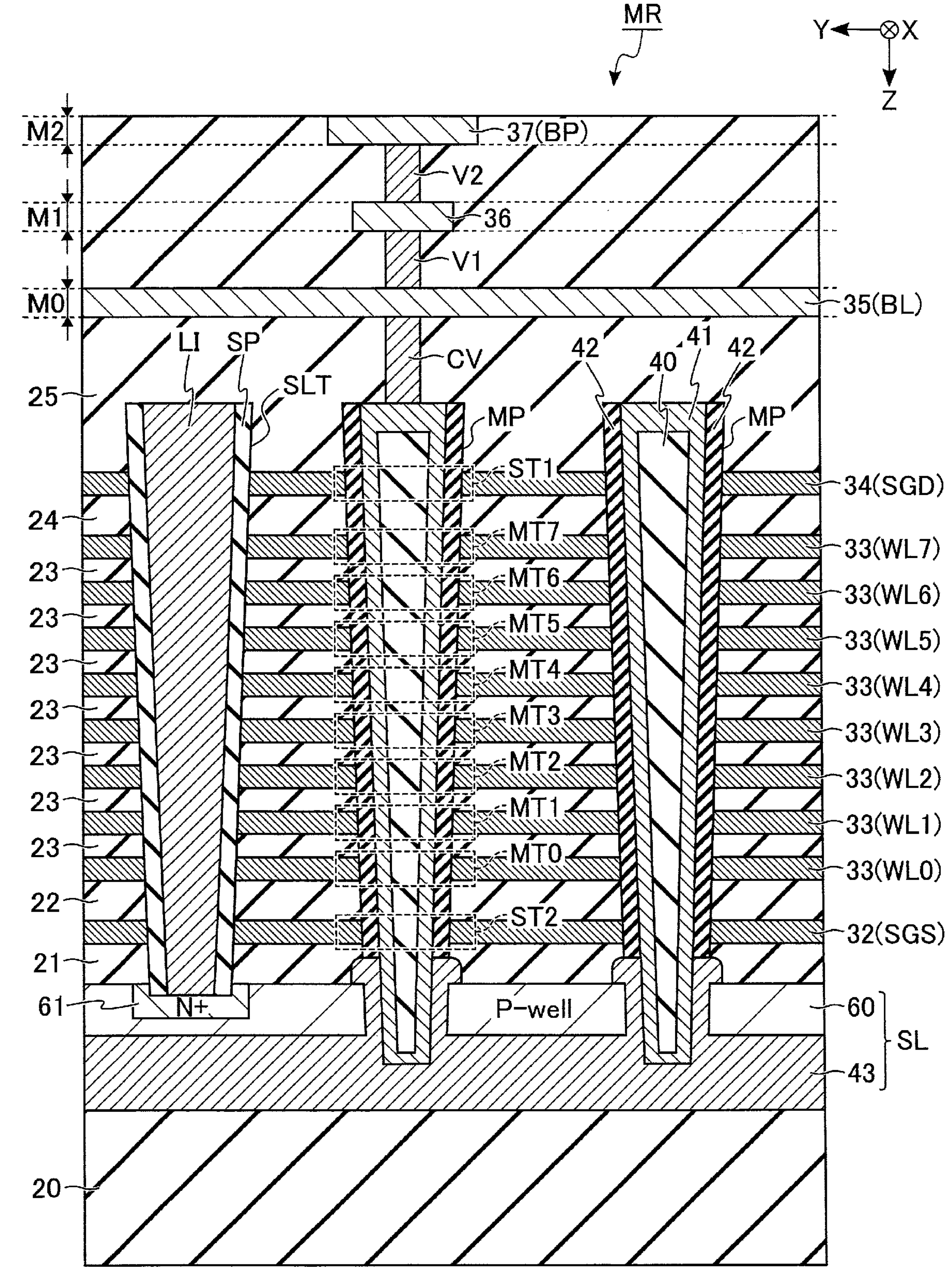
FIG. 19 is a cross-sectional view illustrating an example of a cross-sectional structure including a memory region of a semiconductor memory device according to a second modification of the embodiment.

FIG. 19 is an example of a cross-sectional structure in a memory region MR of a semiconductor memory device 1 according to the second modification of the embodiment, and illustrates the same region as in FIG. 7. As illustrated in FIG. 19, the semiconductor memory device 1 according to the second modification of the embodiment is different in the structure of the source line SL from the semiconductor memory device 1 according to the first modification of the embodiment.

Specifically, the semiconductor memory device 1 according to the second modification of the embodiment has a structure in which the semiconductor layer 43 is also formed between the semiconductor layer 60 and the insulator layer 20, as compared with the semiconductor memory device 1 according to the first modification of the embodiment. That is, in the manufacturing process of the semiconductor memory device 1 according to the second modification of the embodiment, for example, the process corresponding to step S16 of the embodiment is omitted.

Thus, in the case where the structure of the source line SL using the semiconductor substrate SUB of the memory chip MC is used, the semiconductor layer 43 may cover the upper surface of the semiconductor layer 60. In addition, the semiconductor layer 43 may cover the semiconductor layer 41 provided at the bottom of the memory pillar MP. Even in such a case, the semiconductor memory device 1 according to the second modification of the embodiment can operate in the same manner as that of the first modification of the embodiment. Furthermore, the semiconductor memory device 1 according to the second modification of the embodiment can reduce the number of manufacturing processes and suppress the manufacturing cost, as compared with the first modification of the embodiment.

(Third Modification)

Figure 20:
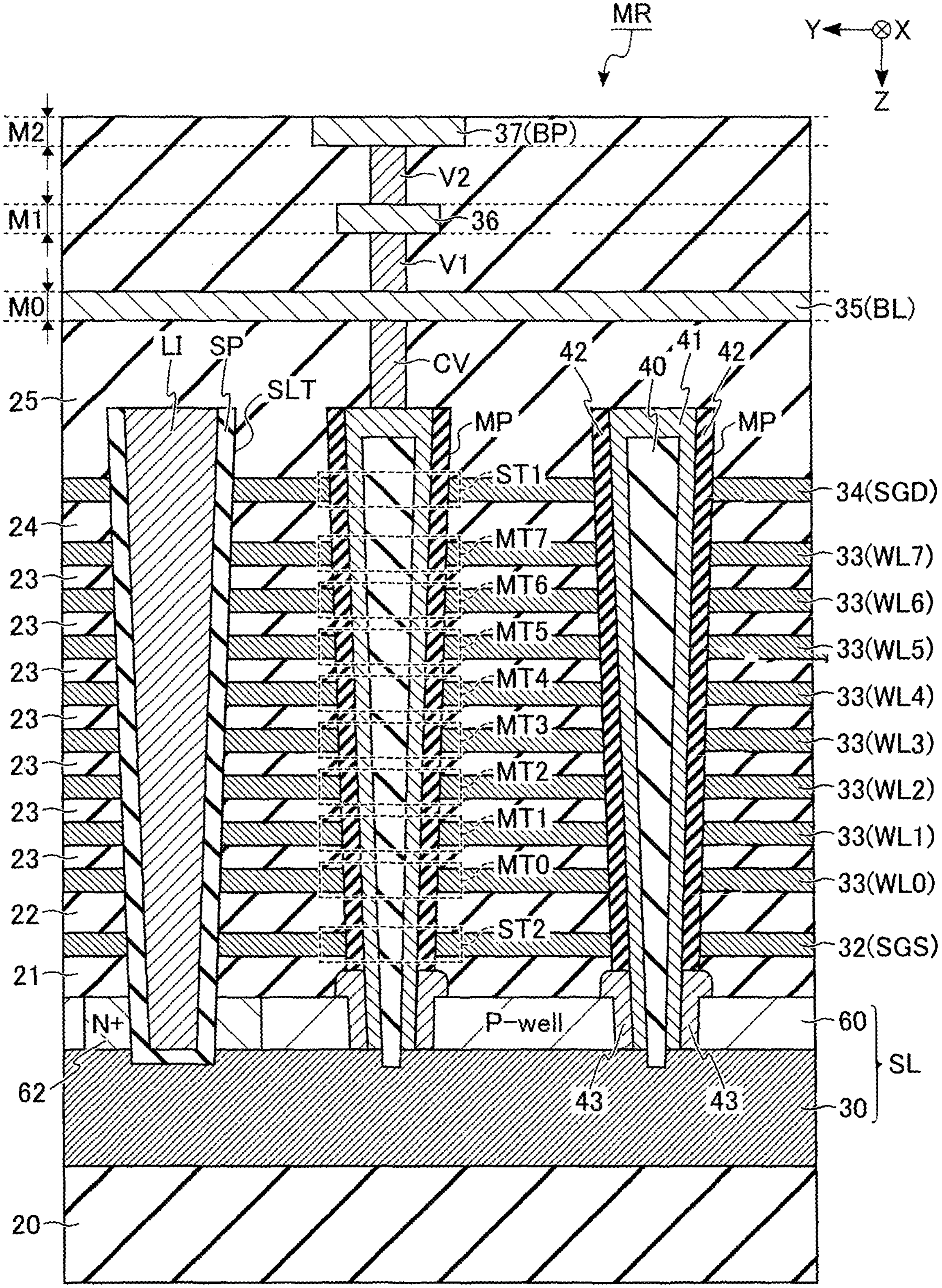
FIG. 20 is a cross-sectional view illustrating an example of a cross-sectional structure including a memory region of a semiconductor memory device according to a third modification of the embodiment.

FIG. 20 is an example of a cross-sectional structure in a memory region MR of a semiconductor memory device 1 according to the third modification of the embodiment, and illustrates the same region as in FIG. 7. As illustrated in FIG. 20, the semiconductor memory device 1 according to the third modification of the embodiment has a structure that combines the embodiment and the first modification of the embodiment.

Specifically, the semiconductor memory device 1 according to the third modification of the embodiment has a configuration in which the semiconductor layer 31 is replaced with a semiconductor layer 60, as compared with the semiconductor memory device 1 according to the embodiment. As in the first modification of the embodiment, the semiconductor layer 60 corresponds to a P-type well region. The conductor layer 30 in the third modification of the embodiment is in contact with the semiconductor layer 60, the spacer SP in the slit SLT, and the semiconductor layers 41 and 43 in the memory pillar MP.

The semiconductor layer 60 in the third modification of the embodiment includes an N-type diffusion region 62. The N-type diffusion region 62 is arranged at the bottom of the slit SLT and, for example, is divided by the slit SLT. That is, the N-type diffusion region 62 is in contact with, for example, both the insulator layer 21 and the conductor layer 30. In the third modification of the embodiment, the conductor layer 30 is used as the source line SL in the embodiment. Other structures of the semiconductor memory device 1 according to the third modification of the embodiment are the same as those of the embodiment.

In the semiconductor memory device 1 according to the third modification of the embodiment described above, the semiconductor layer 60 formed on the semiconductor substrate SUB is used similarly to the semiconductor layer 31 in the embodiment. In addition, in the semiconductor memory device 1 according to the third modification of the embodiment, the barrier between the N-type diffusion region 62 and the conductor layer 30 can be lowered by applying a voltage to the contact LI, thus making it possible to reduce the resistance value of the source line SL. As a result, the semiconductor memory device 1 according to the third modification of the embodiment can improve the yield similarly to the first modification of the embodiment and improve the operation speed similarly to the embodiment.

<6> Others

In the above embodiment, the memory pillar MP may have a structure in which two or more pillars are connected in the Z direction. In addition, the memory pillar MP may have a structure in which a pillar corresponding to the select gate line SGD and a pillar corresponding to the word line WL are connected. Each of the memory pillar MP and the contacts CV, CS, C0 to C3, V1, and V2 may have a tapered shape or a reverse tapered shape, or may have a shape with a bulged intermediate portion (bowing shape). Similarly, the slit SLT may have a tapered shape or a reverse tapered shape, or may have a shape with a bulged intermediate portion. The cross-sectional structure of the memory pillar MP may be elliptical and may be designed in any shape.

In the embodiment, the memory cell array 10 may have one or more dummy word lines between the word line WL0 and the select gate line SGS and between the word line WL7 and the select gate line SGD. When the dummy word line is provided, dummy transistors are provided so as to correspond to the number of dummy word lines between the memory cell transistor MT0 and the select transistor ST2 and between the memory cell transistor MT7 and the select transistor ST1. The dummy transistor has a structure similar to that of the memory cell transistor MT, and is not used to store data. When two or more memory pillars MP are connected in the Z direction, the memory cell transistor MT in the vicinity of the connected portion of the pillars may be used as the dummy transistor.

In the embodiment, reducing the wiring resistance of the source line SL is effective, for example, for suppressing the power consumption of the semiconductor memory device 1. In addition, reducing the wiring resistance of the source line SL is also expected to improve the operation speed of the semiconductor memory device 1.

The term "connecting" herein refers to electrical connection, and does not exclude connection by way of other elements. The expression "electrically connected" may be applied to connecting components with an insulator interposed between if the components are able to operate in the same manner as when being electrically connected. The term "columnar" refers to a structure provided in a hole formed in the manufacturing process of the semiconductor memory device 1. The term "plan view" corresponds to viewing an object in a direction perpendicular to, for example, the surface of the semiconductor substrate 50. The term "region" may be regarded as a configuration included by the semiconductor substrate 50 of the CMOS chip CC. For example, if it is defined that the semiconductor substrate 50 includes the memory region MR, the memory region MR is associated with a region above the semiconductor substrate 50.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor memory device comprising:

a substrate;

a first conductor layer having a portion provided to extend in a first direction in a first layer above the substrate;

a plurality of second conductor layers provided to be apart from each other in a second direction intersecting the first direction above the first layer;

a first semiconductor layer having a portion provided to spread in a third direction intersecting each of the first direction and the second direction, and the first direction, in a layer above the plurality of second conductor layers;

a pillar provided to extend in the second direction and having a portion provided to penetrate the plurality of second conductor layers and the first semiconductor layer; and a contact electrically connected to the pillar and the first conductor layer, wherein the pillar includes a second semiconductor layer provided to extend in the second direction, a first insulator layer provided at least between the second semiconductor layer and the plurality of second conductor layers, and a third semiconductor layer provided between the second semiconductor layer and the first semiconductor layer and in contact with each of the second semiconductor layer and the first semiconductor layer.

2. The semiconductor memory device of claim 1, wherein the third semiconductor layer is non-doped silicon.

3. The semiconductor memory device of claim 1, wherein a boundary is provided between the first semiconductor layer and the third semiconductor layer.

4. The semiconductor memory device of claim 1, wherein the first semiconductor layer is silicon containing an N-type impurity.

5. The semiconductor memory device of claim 4, further comprising:

a third conductor layer provided on the first semiconductor layer; and a first member provided to spread along the second direction and the third direction, and having a portion dividing the plurality of second conductor layers and the first semiconductor layer and a portion in contact with the third conductor layer, wherein the third conductor layer is metal, and the first member includes a fourth conductor layer provided to spread along the second direction and the third direction, and a second insulator layer provided at least between the fourth conductor layer and the plurality of second conductor layers, the first semiconductor layer, and the third conductor layer.

6. The semiconductor memory device of claim 5, further comprising:

a controller configured to perform a read operation, wherein the first conductor layer is used as a bit line, each of the plurality of second conductor layers is used as a word line, the first semiconductor layer and the third conductor layer are used as source lines, a portion where the pillar and the second conductor layer intersect each other functions as a memory cell transistor, and the controller applies a first voltage to the third conductor layer, applies a second voltage higher than the first voltage to the first conductor layer, and applies a third voltage higher than the first voltage to the fourth conductor layer in the read operation.

7. The semiconductor memory device of claim 1, wherein the first semiconductor layer is silicon containing a P-type impurity.

8. The semiconductor memory device of claim 7, further comprising:

a first member provided to spread along the second direction and the third direction, and having a portion dividing the plurality of second conductor layers and a portion in contact with the first conductor layer, wherein the first semiconductor layer includes a diffusion region doped with an N-type impurity, the first member includes a fourth conductor layer provided to spread along the second direction and the third direction and in contact with the diffusion region, and a second insulator layer provided at least between the plurality of second conductor layers and the fourth conductor layer, and the fourth conductor layer is used as a source line.

9. The semiconductor memory device of claim 7, further comprising:

a third conductor layer provided on the first semiconductor layer; and a first member provided to spread along the second direction and the third direction, and having a portion dividing the plurality of second conductor layers and the first semiconductor layer and a portion in contact with the third conductor layer, wherein the third conductor layer is metal, the first semiconductor layer includes a diffusion region doped with an N-type impurity and divided by the first member, and the first member includes a fourth conductor layer provided to spread along the second direction and the third direction, and a second insulator layer provided at least between the fourth conductor layer and the plurality of second conductor layers, the diffusion region of the first semiconductor layer, and the third conductor layer.

10. The semiconductor memory device of claim 1, further comprising:

a sense amplifier provided on the substrate; and a fifth conductor layer provided in a second layer between the substrate and the first layer and connected between the sense amplifier and the first conductor layer, wherein the fifth conductor layer contains copper.

* * * * *